United States Patent
Miyazaki et al.

(10) Patent No.: US 10,595,398 B2
(45) Date of Patent: Mar. 17, 2020

(54) OPTICAL MODULATOR WITH FPC, AND OPTICAL TRANSMISSION APPARATUS USING SAME

(71) Applicant: Sumitomo Osaka Cement Co., Ltd, Tokyo (JP)

(72) Inventors: Norikazu Miyazaki, Tokyo (JP); Toru Sugamata, Tokyo (JP)

(*) Notice: Subject to any disclaimer, the term of this patent is extended or adjusted under 35 U.S.C. 154(b) by 0 days.

(21) Appl. No.: 15/770,649

(22) PCT Filed: Sep. 15, 2016

(86) PCT No.: PCT/JP2016/077241
§ 371 (c)(1),
(2) Date: Apr. 24, 2018

(87) PCT Pub. No.: WO2017/163459
PCT Pub. Date: Sep. 28, 2017

(65) Prior Publication Data
US 2019/0014657 A1 Jan. 10, 2019

(30) Foreign Application Priority Data
Mar. 25, 2016 (JP) .................. 2016-062460

(51) Int. Cl.
*H05K 1/02* (2006.01)
*G02F 1/035* (2006.01)
(Continued)

(52) U.S. Cl.
CPC .......... *H05K 1/0271* (2013.01); *G02F 1/035* (2013.01); *G02F 1/2255* (2013.01); *H05K 1/028* (2013.01);
(Continued)

(58) Field of Classification Search
CPC .... H05K 1/0271; H05K 1/0277; H05K 1/028; H05K 1/0281; H05K 1/111
See application file for complete search history.

(56) References Cited

U.S. PATENT DOCUMENTS 8,712,195 B2 4/2014 Sugiyama
9,107,297 B2 8/2015 Sugiyama
(Continued)

FOREIGN PATENT DOCUMENTS

JP 2002134860 A 5/2002
JP 2006228988 A 8/2006
(Continued)

*Primary Examiner* — Hoa C Nguyen
(74) *Attorney, Agent, or Firm* — IpHorgan Ltd.

(57) ABSTRACT

To suppress peeling-off or cracks of a solder-fixing portion, which are caused by vibration during transportation or operation, in an optical modulator with FPC, thereby suppressing deterioration of radio-frequency characteristics of a signal path in an effective manner at low cost.
An optical modulator 100 includes a flexible printed circuit (106) that performs electrical connection with a circuit substrate. The flexible printed circuit has a substantially quadrilateral shape. In the flexible printed circuit, a pad (210 and the like), which is electrically connected to the circuit substrate, is provided along one side of the substantial quadrilateral. In addition, in the flexible printed circuit, signal patterns (220 and the like), which are connected to signal lead pins (120 and the like) for signal transmission which is provided in the optical modulator, are provided in another side opposite to the one side. In addition, the flexible printed circuit includes an additional fixing portion (240 and the like) and/or a notched portion (810 and the like) which are configured to increase a natural vibration frequency of the flexible printed circuit in a state of being connected to the signal lead pin and the circuit substrate.

12 Claims, 11 Drawing Sheets

(51) Int. Cl.
*G02F 1/225* (2006.01)
*H05K 1/11* (2006.01)
*G02F 1/21* (2006.01)

(52) U.S. Cl.
CPC ........ *H05K 1/111* (2013.01); *G02F 2001/212* (2013.01)

(56) References Cited

U.S. PATENT DOCUMENTS

| | | | |
|---|---|---|---|
| 9,507,235 B2 | 11/2016 | Sugiyama | |
| 2010/0006863 A1* | 1/2010 | Ban | H01L 31/0203 257/81 |
| 2012/0039572 A1* | 2/2012 | Amirkiai | G02B 6/4278 385/88 |
| 2012/0120619 A1* | 5/2012 | Kodera | H05K 1/0219 361/749 |
| 2014/0099123 A1* | 4/2014 | Kang | G02B 6/4281 398/135 |
| 2016/0011486 A1* | 1/2016 | Sugiyama | G02F 1/21 398/188 |
| 2017/0104542 A1* | 4/2017 | Sugiyama | H05K 1/028 |

FOREIGN PATENT DOCUMENTS

| | | |
|---|---|---|
| JP | 2008135465 A | 6/2008 |
| JP | 2012048121 A | 3/2012 |
| JP | 2013029791 A | 2/2013 |
| JP | 2016020928 A | 2/2016 |

\* cited by examiner

VIEW SEEN IN AA CROSS-SECTIONAL DIRECTION

FIG. 6
| d/Lp | 1/10 | 1/7 | 1/5 | 1/3 | 1/2 | 1 | 1.5 | 2 |
|---|---|---|---|---|---|---|---|---|
| EVALUATION RESULT | × | △ | ○ | ○ | ◎ | ◎ | ◎ | ○ |
FIG. 7
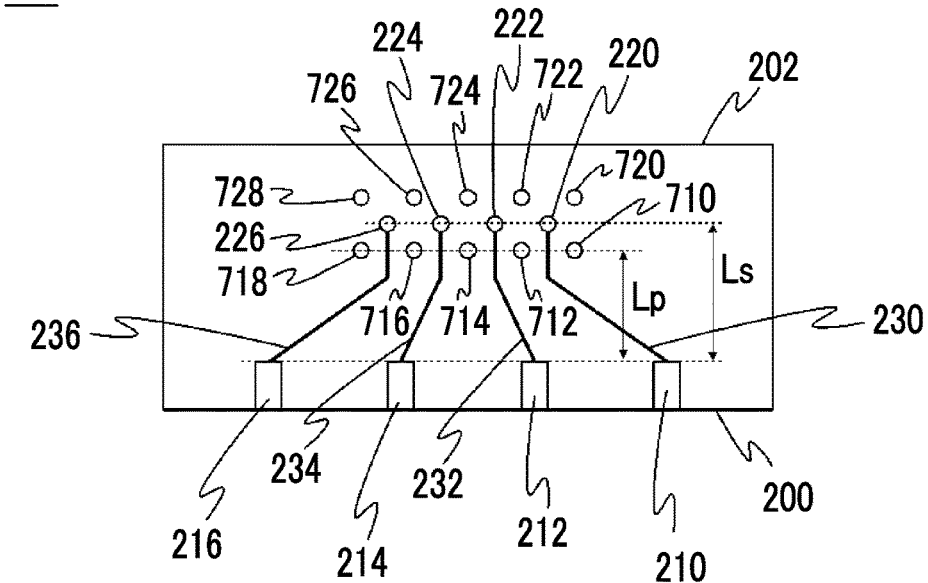
FIG. 8
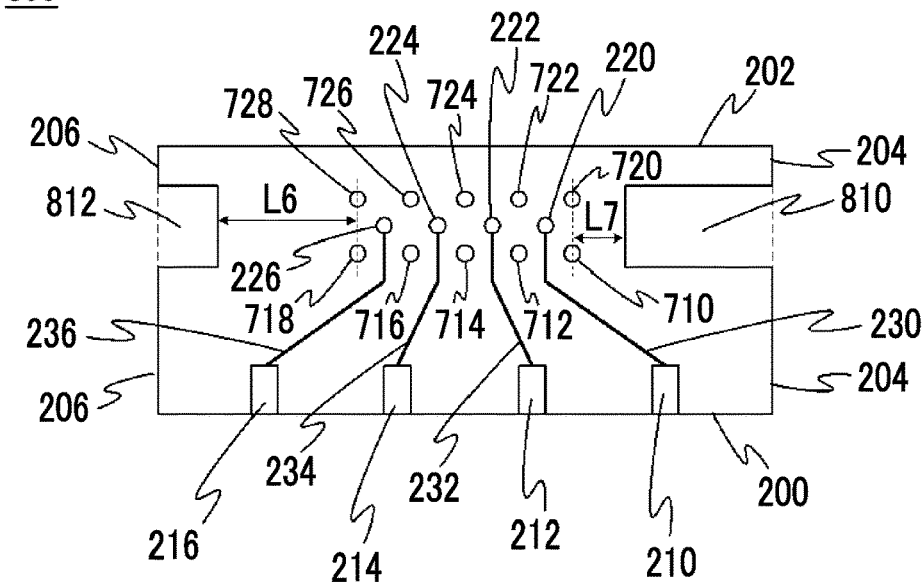

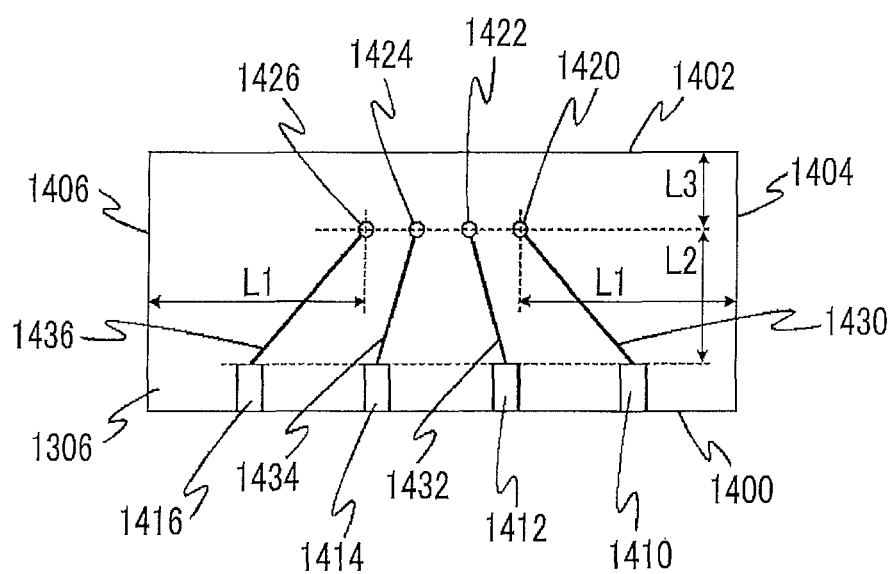

--Prior Art--

VIEW SEEN IN BB CROSS-SECTIONAL DIRECTION

--Prior Art--

OPTICAL MODULATOR WITH FPC, AND OPTICAL TRANSMISSION APPARATUS USING SAME

TECHNICAL FIELD

The present invention relates to an optical modulator and an optical transmission apparatus, and particularly to an optical modulator provided with a flexible printed circuit (FPC) configured to input a radio-frequency signal and an optical transmission apparatus using the same.

BACKGROUND ART

In high-frequency/high-capacity optical fiber communication systems, optical modulators embedded with waveguide-type optical modulation elements are frequently used. Among these, optical modulation elements in which $LiNbO_3$ (hereinafter, also referred to as "LN") having an electro-optic effect is used for substrates cause only a small optical loss and are capable of realizing broad optical modulation characteristics and are thus widely used for high-frequency/high-capacity optical fiber communication systems.

The optical modulation element using LN is provided with a Mach-Zehnder optical waveguide, an RF electrode configured to apply a radio-frequency signal that is a modulation signal to the optical waveguide, and a bias electrode configured to perform various kinds of adjustment so as to maintain modulation characteristics in the waveguide in a satisfactory manner. In addition, the electrodes provided in the optical modulation element are connected to an external electronic circuit via lead pins or a connector that is provided in a housing of the optical modulator in which the optical modulation element is accommodated.

On the other hand, with regard to a modulation form in the optical fiber communication systems, a transmission format such as QPSK (quadrature phase shift keying) and DP-QPSK (dual polarization-quadrature phase shift keying) which use multi-level modulation or in which multiplexing is introduced to the multi-level modulation becomes a main stream in pursuit of a recent increase in transmission capacity.

An optical modulator (QPSK optical modulator) that performs QPSK modulation or an optical modulator (DP-QPSK optical modulator) that performs DP-QPSK modulation includes a plurality of Mach-Zehnder optical waveguides having a box structure, a plurality of radio-frequency signal electrodes, and a plurality of bias electrodes (for example, refer to Patent Literature 1). Accordingly, the size of the housing of the optical modulator tends to increase, and thus there is a strong demand for, particularly, miniaturization.

As one countermeasure for coping with the demand for miniaturization, in the related art, there is suggested an optical modulator in which a push-on type coaxial connector provided in a housing of the optical modulator as an interface of the RF electrodes is substituted with lead pins similar to an interface of the bias electrodes, and a flexible printed circuit (FPC) configured to connect the lead pins to an external circuit substrate is provided.

For example, in the DP-QPSK optical modulator, an optical modulation element including four Mach-Zehnder optical waveguides each including an RF electrode is used. In this case, in a case where four push-on type coaxial connectors are provided in the housing of the optical modulator, it is difficult to avoid an increase in size of the housing, but when using the lead pins and the FPC instead of the coaxial connectors, it is possible to realize miniaturization.

In addition, the lead pins of the housing of the optical modulator, and a circuit substrate on which an electronic circuit configured to allow the optical modulator to perform a modulation operation is mounted are connected to each other through the FPC. Accordingly, it is not necessary to perform coaxial cable excess-length processing that is used in the related art, and thus it is possible to reduce a mounting space of the optical modulator in the optical transmission apparatus.

For example, the FPC that is used in the optical modulator is prepared by using a flexible polyimide-based material as a substrate (hereinafter, referred to as "FPC substrate"), and each of a plurality of through-holes provided in the vicinity of one end is electrically connected to each of the pads provided on the other end through a wiring pattern. In addition, a plurality of lead pins, which protrude from a bottom surface or a lateral surface of the housing of the optical modulator, are respectively inserted into the plurality of through-holes, and are fixed and electrically connected to the plurality of through-holes, for example, by using solder. The plurality of pads are fixed and connected to the circuit substrate, for example, by using solder. According to this, a radio-frequency signal, which is applied from the pads on the circuit substrate, is applied to a corresponding RF electrode of the optical modulation element through corresponding through-hole and lead pin, and thus high-frequency optical modulation is performed.

In the optical modulator using the FPC, as described above, it is possible to miniaturize the housing, and it is also possible to reduce a mounting space of the optical modulator on the circuit substrate, and thus it is possible to greatly contribute to miniaturization of the optical transmission apparatus.

FIG. 13A, FIG. 13B, and FIG. 13C are views illustrating a configuration of an optical modulator provided with the FPC in the related art. FIG. 13A is a top view of the optical modulator, FIG. 13B is a front view thereof, and FIG. 13C is a bottom view thereof. An optical modulator 1300 includes an optical modulation element 1302, a housing 1304 that accommodates the optical modulation element 1302, a flexible printed circuit (FPC) 1306, an optical fiber 1308 through which a light beam is input to the optical modulation element 1302, and an optical fiber 1310 that guides the light beam output from the optical modulation element 1302 to the outside of the housing 1304.

The housing 1304 is provided with four lead pins 1320, 1322, 1324, and 1326 which are respectively connected to four RF electrodes (not illustrated) of the optical modulation element 1302, and the lead pins 1320, 1322, 1324, and 1326 are inserted into the following through-holes 1420, 1422, 1424, and 1426 which are provided in the FPC 1306, and are fixed and electrically connected thereto, for example, by using solder.

FIG. 14 is a view illustrating a configuration of the FPC 1306. In the FPC 1306, four pads 1410, 1412, 1414, and 1416 are provided in parallel in the vicinity of one side 1400 on a lower side in the drawing along a direction of the one side 1400. In addition, four through-holes 1420, 1422, 1424, and 1426 are provided in parallel on another side 1402 side that is opposite to the side 1400, for example, along a direction of the side 1402. In addition, the four pads 1410, 1412, 1414, and 1416 are respectively electrically connected to the through-holes 1420, 1422, 1424, and 1426 by wiring patterns 1430, 1432, 1434, and 1436.

In addition, the four pads 1410, 1412, 1414, and 1416 are respectively fixed and electrically connected to pads of the external circuit substrate, for example, by using solder. According to this, RF electrodes of the optical modulation element 1302 provided in the optical modulator 1300 and an electronic circuit configured on the circuit substrate are electrically connected to each other. In this state, the optical modulator 1300 is mounted in the optical transmission apparatus. Furthermore, as illustrated in the drawing, typically, a shape of the FPC 1306 is a horizontally elongated rectangular shape having short sides in a signal transmission direction to make the wiring patterns very short and to suppress a microwave loss to a low value. In a case where the four pads 1410, 1412, 1414, and 1416 are provided as in an example illustrated in the drawing, the shape becomes a rectangular shape having dimensions of approximately 20 mm or less in a long-side direction and approximately 10 mm or less in a short-side direction.

FIG. 15A and FIG. 15B are views illustrating an example of a state in which the optical modulator 1300 is connected to the circuit substrate in which the electronic circuit is constructed. FIG. 15A is a view seen from an upper surface direction of the optical modulator 1300, and FIG. 15B is a cross-sectional arrow view taken along line BB in FIG. 15A. Furthermore, description of an internal configuration of the optical modulator 1300 in FIG. 15B is omitted.

For example, the optical modulator 1300 and a circuit substrate 1500 are fixed to a base 1502 inside the housing of the optical transmission apparatus. As illustrated in FIG. 15A, the FPC 1306 of the optical modulator 1300 extends from a connection portion with the lead pins 1320, 1322, 1324, and 1326 toward a left side in the drawing, and a left end thereof is bent in an oblique lower-left direction in the drawing in order for a left end to come into contact with the circuit substrate 1500 as illustrated in FIG. 15B. According to this, the pads 1410, 1412, 1414, and 1416 of the FPC 1306 are fixed and electrically connected to pads 1510, 1512, 1514, and 1516 on the circuit substrate 1500, for example, by using solder (FIG. 15A).

However, when the optical modulator with FPC is connected to a circuit substrate inside the optical transmission apparatus, and the optical transmission apparatus is transported and an operation thereof is initiated, peeling-off or cracks may occur in a solder-fixing portion or a solder-connecting portion between the lead pins 1320, 1322, 1324, and 1326 of the housing 1304 of the optical modulator and the through-holes 1420, 1422, 1424, and 1426 of the FPC 1306 due to vibration in an installation environment in the middle of the transportation or during the operation. As a result, radio-frequency characteristics may deteriorate or vary during reaching the lead pins 1320, 1322, 1324, and 1326 from the pads 1410, 1412, 1414, and 1416 of the FPC 1306, and thus a problem may be caused in optical modulation characteristics in the optical modulator 1300.

As described above, in the FPC 1306, the through-holes 1420, 1422, 1424, and 1426 are fixed and electrically connected to the lead pins 1320, 1322, 1324, and 1326 of the housing 1304 of the optical modulator during manufacturing of the optical modulator 1300, for example, by using solder. In addition, when using the optical modulator 1300 in the optical transmission apparatus, the pads 1410, 1412, 1414, and 1416 are fixed and electrically connected to the pads 1510, 1512, 1514, and 1516 on the circuit substrate 1500, for example, by using solder. At this time, as can be seen from FIG. 14, in the FPC 1306, a portion from the through-hole 1420 (that is, a solder-fixing portion or a solder-connecting portion with the lead pin 1320) to a side 1404 on a right side in the drawing, and a portion from the through-hole 1426 (a solder-fixing portion or a solder-connecting portion with the lead pin 1326) to a side 1406 on a left side in the drawing respectively constitute cantilever beams (respectively referred to as "first and second cantilever beams") having a length L1, and vibrate in correspondence with vibration (environmental vibration) under an environment in which the optical modulator 1300 is installed. In addition, similarly, a portion from the through-holes 1420, 1422, 1424, and 1426 (that is, a fixing portion with the lead pins 1320, 1322, 1324, and 1326) to the pads 1410, 1412, 1414, and 1416 constitutes a double-supported beam having a length L2, and a portion from the through-holes 1420, 1422, 1424, and 1426 to the side 1402 on an upper side in the drawing constitutes a cantilever beam (referred to as "third cantilever beam") having a length L3. The respective portions vibrate in correspondence with the environmental vibration (that is, in the rectangular FPC illustrated in FIG. 14, four vibration modes including vibration of the double-supported beam, and three kinds of vibration of the first to third cantilever beams).

As the environmental vibration, in addition to vibration during transportation or assembly of the optical modulator 1300 and the optical transmission apparatus that uses the optical modulator 1300, there may be many factors such as vibration of a heat radiation fan provided in the optical transmission apparatus, a cooling fan of an apparatus rack in which the optical transmission apparatus is accommodated, air-conditioning vibration of a room in which the optical modulation device is installed, various kinds of vibration transmitted to a building in which the optical modulation device is installed.

In addition, particularly, in a case where a frequency of the environmental vibration is close to a natural vibration frequency that is determined by substrate rigidity of the FPC 1306, the lengths L1, L2, and L3, and the like, the cantilever beam portion or the double-supported beam portion may vibrate with a great amplitude as in resonant vibration. As a result, peeling-off or cracks may occur at the solder-fixing portion or the solder-connecting portion between the through-holes 1420, 1422, 1424, and 1426 and the lead pins 1320, 1322 1324, and 1326 which functions as a fixed end of the beam portions.

Here, the natural frequency of the beam portions becomes lower as the lengths L1, L2, and L3 corresponding thereto are long, and enters a frequency range in which a power spectrum density in the environmental vibration is great. As a result, the natural frequency is susceptible to an influence of the environmental vibration. For example, in a case of the FPC 1306 having a configuration as illustrated in FIG. 14, the portion of the length L1 or L2 is more susceptible to the influence of the environmental vibration in comparison to the portion of the length L3. More specifically, for example, the portion of the length L1 in FIG. 14 vibrates as indicated by a bold-line arrow in FIG. 16A, and may cause peeling-off or cracks to occur, particularly, in the solder-fixing portion or the solder-connecting portion of the lead pins 1320 and 1326, and the portion of length L2 in FIG. 14 vibrates as indicated by a bold-line arrow in FIG. 16B and may cause peeling-off or cracks to occur in the solder-fixing portion or the solder-connecting portion of the lead pins 1322, 1324, and 1326.

Particularly, an inner diameter of the through-holes 1420, 1422, 1424, and 1426 is as small as several hundreds of μm similar to a diameter of the lead pins 1320, 1322, 1324, and 1326 when considering that a frequency of a radio-frequency signal applied to the optical modulation element 1302 may be up to approximately several tens of GHz, and the through-holes is more susceptible to the influence of the environmental vibration in comparison to a typical electronic apparatus that deals with lead pins of approximately 1 mm.

SUMMARY OF INVENTION

Technical Problem

From the background, in an optical modulator including an FPC that performs electrical connection with an external circuit substrate, it is required to suppress peeling-off or cracks, which are caused by vibration during transportation or operation, in a fixing portion or an electrical connecting portion, for example, by using solder so as to suppress deterioration of radio-frequency characteristics of a signal path in an effective manner at low cost.

Solution to Problem

According to an aspect of the invention, there is provided an optical modulator including a flexible printed circuit that performs electrical connection with a circuit substrate. In the optical modulator, the flexible printed circuit has a substantially quadrilateral shape. In the flexible printed circuit, a pad, which is electrically connected to the circuit substrate, is provided along one side of the substantial quadrilateral, and signal patterns, which are connected to signal lead pins for signal transmission which are provided in the optical modulator, are provided in another side opposite to the one side. In addition, the flexible printed circuit includes an additional fixing portion and/or a notched portion which are configured to increase a natural vibration frequency of the flexible printed circuit in a state of being connected to the signal lead pin and the circuit substrate.

According to another aspect of the invention, the additional fixing portion may include an additional pattern that is connected to an additional lead pin that is additionally provided in the optical modulator in addition to the signal lead pin.

According to still another aspect of the invention, the additional pattern may be configured to electrically connect a ground pattern provided in the flexible printed circuit and a housing of the optical modulator to each other.

According to still another aspect of the invention, the additional fixing portions may be configured with the additional patterns provided at respective sites between two sides excluding the one side and the other side of the substantial quadrilateral, and respective ends of an arrangement portion of the signal patterns, the number of the additional pattern provided at each of the sites being at least one.

According to still another aspect of the invention, the additional fixing portions may include at least one of the additional patterns provided between the arrangement portion and the one side.

According to still another aspect of the invention, the additional fixing portions may further include at least one of the additional pattern that is provided between the arrangement portion and the other side.

According to still another aspect of the invention, a distance d, which is measured in a direction perpendicular to the one side, between the additional pattern provided between the arrangement portion and the one side, and the additional pattern provided between the arrangement portion and the other side may have a relationship of d≥Lp/5 with respect to a distance Lp, which is measured in a direction perpendicular to the one side, between a pad end opposite to the one side and the additional pattern provided between the arrangement portion and the one side.

According to still another aspect of the invention, the additional pattern provided between the arrangement portion and the one side, and the additional pattern provided between the arrangement portion and the other side may be disposed to surround the signal patterns from all directions.

According to still another aspect of the invention, the additional fixing portions may further include the additional patterns provided at respective sites between two sides excluding the one side and the other side, and respective ends of the arrangement portion, the number of the additional pattern provided at each of the sites being at least one.

According to still another aspect of the invention, a notched portion may be provided from each of the two sides excluding the one side and the other side toward the arrangement portion.

According to still another aspect of the invention, the notched portion may be provided at each of two corners made by two sides excluding the one side and the other side opposite to the one side, and the other side, and the notched portion may be provided so that a distance between the respective ends of the arrangement portion and an edge of the notched portion along the one side varies in accordance with a distance that is measured from the one side along a direction perpendicular to the one side.

According to still another aspect of the invention, the arrangement portion may include one or a plurality of arrangement portions, and distances between respective ends of two arrangement portions closest to the two sides excluding the one side and the other side, and the corresponding two sides are different from each other.

According to still another aspect of the invention, there is provided an optical transmission apparatus including: the optical modulator according to any one of the aspects; and an electronic circuit that outputs an electrical signal to the optical modulator to allow the optical modulator to perform a modulation operation.

BRIEF DESCRIPTION OF DRAWINGS

FIG. 6 is a view illustrating an evaluation result for a relationship between a position of an additional through-hole and the degree of occurrence of peeling-off/cracks of a solder-fixing portion or a solder-connecting portion after vibration/impact in the FPC illustrated in FIG. 5.

FIG. 7 is a view illustrating a third modification example of the FPC that is used in the optical modulator illustrated in FIG. 1A.

FIG. 8 is a view illustrating a fourth modification example of the FPC that is used in the optical modulator illustrated in FIG. 1A.

FIG. 14 is a view illustrating a configuration of an FPC that is used in the optical modulator illustrated in FIG. 13A.

DESCRIPTION OF EMBODIMENTS

Hereinafter, embodiments of the invention will be described with reference to the accompanying drawings.

First Embodiment

An optical modulator of this embodiment includes a substantially quadrilateral flexible printed circuit that performs electrical connection with a circuit substrate, and the flexible printed circuit is connected to signal lead pins which are provided in a housing of the optical modulator. In addition, the flexible printed circuit includes an additional fixing portion configured to increase a natural vibration frequency of vibration in which a connection portion between the flexible printed circuit, and the signal lead pins and the circuit substrate is set as a fixed end. In addition, the additional fixing portion includes an additional wiring pattern that is connected to additional lead pins which are additionally provided in a housing of the optical modulator in addition to the signal lead pin.

Figure 1A:
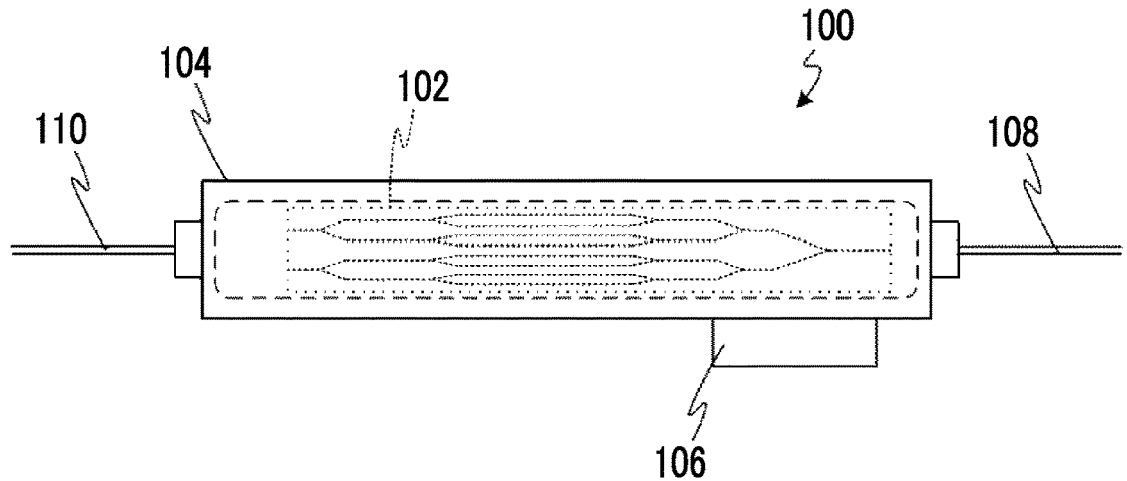
FIG. 1A is a top view of an optical modulator according to a first embodiment of the invention.
Figure 1B:
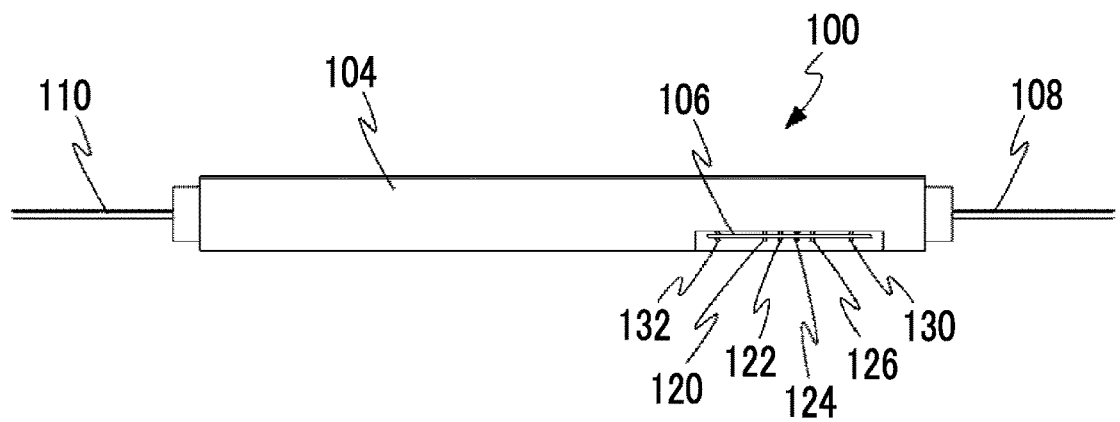
FIG. 1B is a side view of the optical modulator according to the first embodiment of the invention.
Figure 1C:
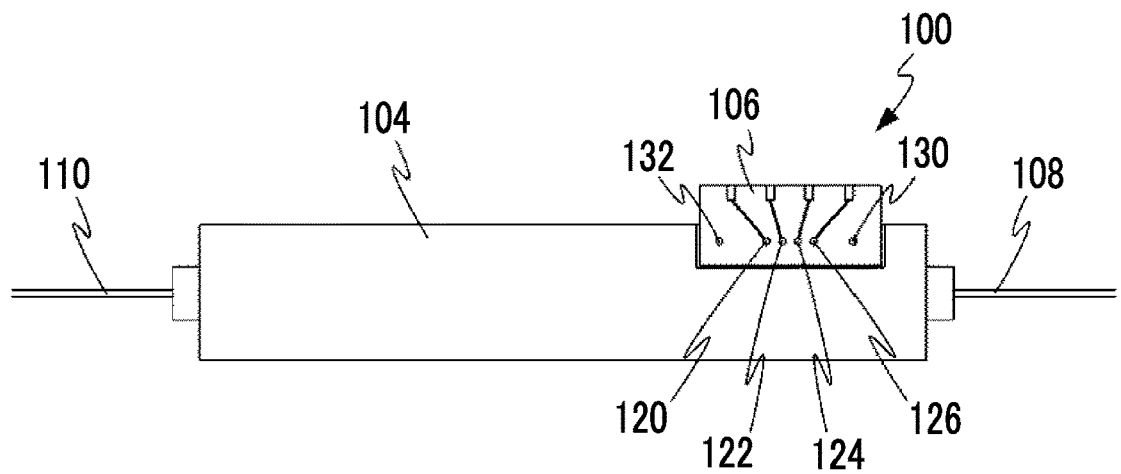
FIG. 1C is a bottom view of the optical modulator according to the first embodiment of the invention.

FIG. 1A, FIG. 1B, and FIG. 1C are views illustrating a configuration of the optical modulator according to an embodiment of the invention.

An optical modulator 100 includes an optical modulation element 102, a housing 104 that accommodates the optical modulation element 102, a flexible printed circuit (FPC) 106, an optical fiber 108 that allows a light beam to be input to the optical modulation element 102, and an optical fiber 110 that guides a light beam output from the optical modulation element 102 to the outside of the housing 104.

The optical modulation element 102 is a DP-QPSk optical modulator including four Mach-Zehnder optical waveguides provided, for example, on an LN substrate, and four radio-frequency electrodes (RF electrodes) which are respectively provided on the Mach-Zehnder optical waveguides and modulate a light wave propagating through the inside of an optical waveguide. Two light beams which are output from the optical modulation element 102 are combined into one light beam, for example, by a lens optical system, and the resultant light beam is guided to the outside of the housing 104 through the optical fiber 110.

The housing 104 includes four signal lead pins 120, 122, 124, and 126 which are respectively connected to four RF electrodes (not illustrated) which are provided in the optical modulation element 102. The signal lead pins 120, 122, 124, and 126 which are provided in the housing 104 are respectively inserted into the following signal through-holes 220, 222, 224, and 226 which are provided in the FPC 106, and each of the signal through-holes 220, 222, 224, and 226 and each of the signal lead pins 120, 122, 124, and 126 are connected and fixed, for example, using solder.

Figure 2:
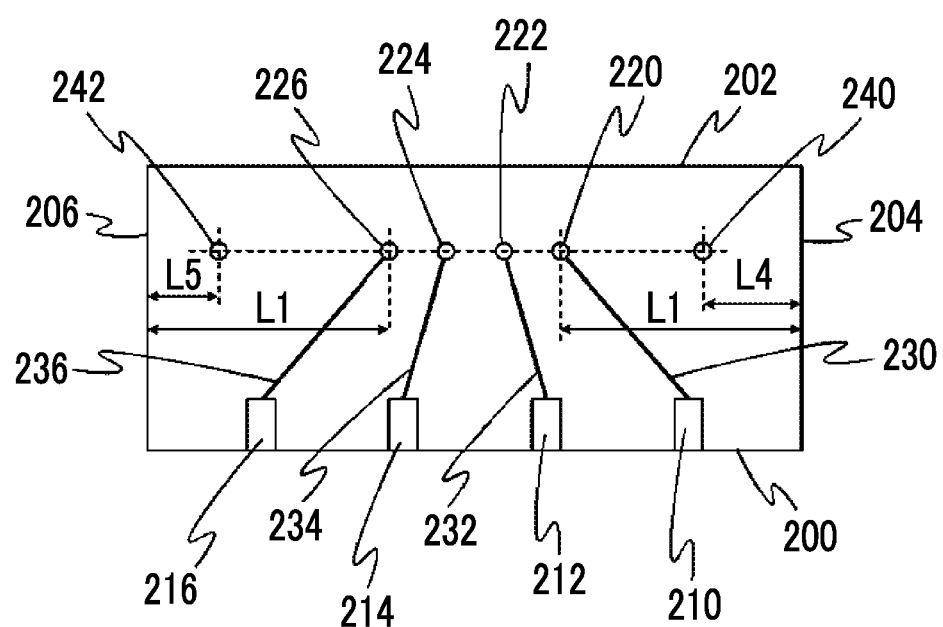
FIG. 2 is a view illustrating a configuration of an FPC that is used in the optical modulator illustrated in FIG. 1A.

FIG. 2 is a view illustrating a configuration of the FPC 106. The FPC 106 is prepared by using a substrate (hereinafter, referred to as "FPC substrate") in which polyimide is used as the main raw material. For example, the FPC 106 is configured in a rectangular shape in a plan view. As described above, the shape of the FPC 1306 is typically a horizontally elongated rectangular shape so as to suppress a microwave loss to be low by significantly shortening a wiring pattern. According to this, in this embodiment, the FPC 106 is also set to have a rectangular shape similar to the FPC 1306. However, the shape of the FPC 106 is not limited thereto, and may be set to a substantially quadrilateral shape. In the following description, "side" represents a side of a rectangle made by the FPC 106, but in a case where the FPC 106 is configured as the substantial quadrilateral, the "side" represents a side of the substantial quadrilateral made by the FPC 106.

Four pads 210, 212, 214, and 216 are provided in parallel in the vicinity of one side 200 of the FPC 106 on a lower side in the drawing along a direction of the one side 200. In addition, four signal through-holes 220, 222, 224, and 226 are provided in parallel on another side 202 side opposite to the side 200, for example, along a direction of the side 202. In addition, the four pads 210, 212, 214, and 216 are respectively electrically connected to the signal through-holes 220, 222, 224, and 226 by wiring patterns 230, 232, 234, and 236.

As described above, the four signal through-holes 220, 222, 224, and 226 are respectively connected to the four signal lead pins 120, 122, 124, and 126 which are provided in the housing 104. Accordingly, when the pads 210, 212, 214, and 216 are electrically connected to pads which constitute a part of an electronic circuit provided in an external circuit substrate (for example, by using solder), a radio-frequency signal output from the electronic circuit is applied to an RF electrode of the optical modulation element 102 through the FPC 106. That is, the signal through-holes 220, 222, 224, and 226 are signal patterns which are respectively connected to the signal lead pins 120, 122, 124, and 126 for signal transmission which are provided in the optical modulator 100.

The wiring patterns 230, 232, 234, and 236 which are provided in the FPC 106 may be configured by using a line configuration that is known as a radio-frequency signal line such as a micro-strip line, a coplanar line, and a grounded coplanar line. A ground pattern (not illustrated) may be provided on the FPC 106 in conformity to the configuration.

With regard to a size of the FPC 106, as in the FPC 1306 in the related art, for example, a length in a long-side direction (direction of the side 200) is set to approximately 20 mm or less, and a length in a short-side direction (direction perpendicular to the side 200) may be set to approximately 10 mm or less so as to suppress a microwave loss to be low by significantly shortening the wiring patterns 230, 232, 234, and 236.

Figure 3A:
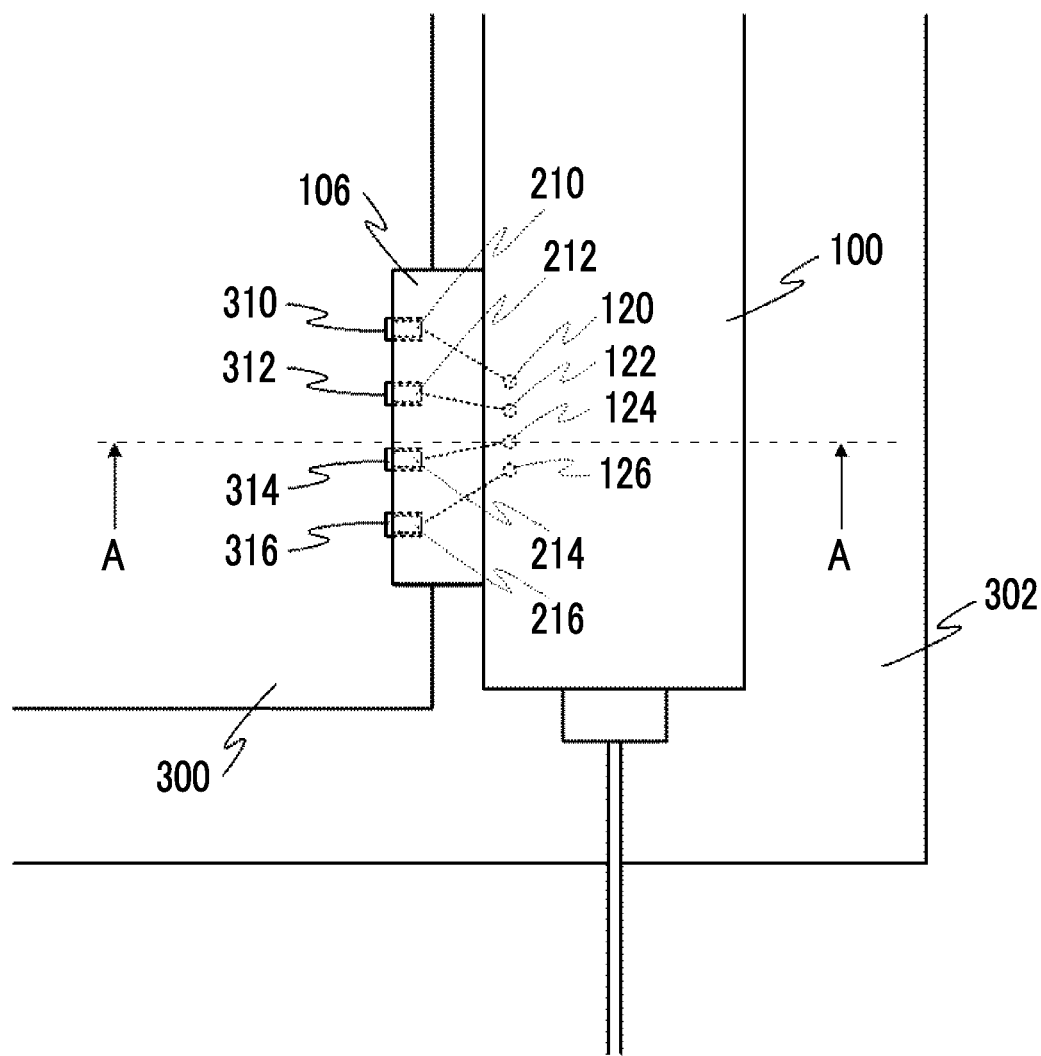
FIG. 3A is a view illustrating an example of a state in which the optical modulator illustrated in FIG. 1A is connected to a circuit substrate in which an electronic circuit is constructed.
Figure 3B:
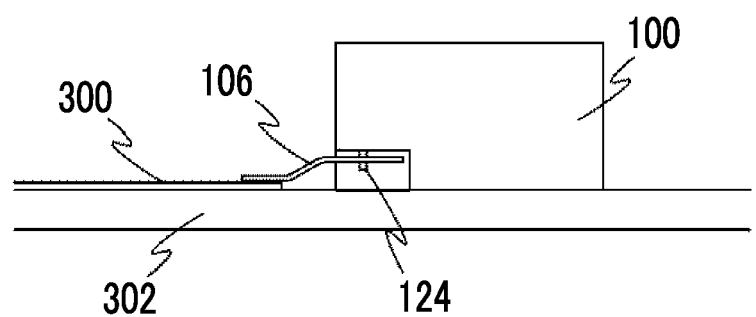
FIG. 3B is a view illustrating an example of a state in which the optical modulator illustrated in FIG. 1A is connected to a circuit substrate in which an electronic circuit is constructed.

FIG. 3A and FIG. 3B are views illustrating an example of a state in which the optical modulator 100 is connected to a circuit substrate in which an electronic circuit is constructed. FIG. 3A is a view seen from an upper surface direction of the optical modulator 100, and FIG. 3B is a cross-sectional arrow view taken along line AA in FIG. 3A. In addition, in FIG. 3B, description of an internal configuration of the optical modulator 100 in FIG. 3B is omitted.

For example, the optical modulator 100 and a circuit substrate 300 are fixed to a base 302 inside a housing of an optical transmission apparatus. As illustrated in FIG. 3A, the FPC 106 of the optical modulator 100 extends from a connection portion with the signal lead pins 120, 122, 124, and 126 toward a left side in the drawing, and is bent in an oblique lower-left direction in the drawing in order for a left end to come into contact with the circuit substrate 300 as illustrated in FIG. 3B. According to this, the pads 210, 212, 214, and 216 of the FPC 106 are fixed and electrically connected to pads 310, 312, 314, and 316 on the circuit substrate 300, for example, by using solder (FIG. 3A).

Particularly, in the optical modulator 100 of this embodiment, as illustrated in FIG. 2, additional through-holes 240 and 242, which are additional patterns, are respectively provided between two sides 204 and 206 excluding the one side 200 in which the pads 210, 212, 214, and 216 are provided, and the other side 202 in which the signal through-holes 220, 222, 224, and 226 are provided, and ends (that is, portions of the signal through-holes 220 and 226), which are close to the two sides 204 and 206, of an arrangement portion of the signal through-holes 220, 222, 224, and 226 which are signal patterns to which the signal lead pins 120, 122, 124, and 126 are connected.

For example, in the example illustrated in the drawing, a distance between the signal through-hole 220 and the side 204 and a distance between the signal through-hole 226 and the side 206 are set to "L1", the additional through-hole 240 is provided between the signal through-hole 220 and the side 204 at a position spaced away from the side 204 by a distance L4 (<L1), and the additional through-hole 242 is provided between the signal through-hole 226 and the side 206 at a position spaced away from the side 206 by a distance L5 (<L1). In addition, the additional through-holes 240 and 242, which are the additional patterns, are respectively fixed and electrically connected to additional lead pins 132 and 130 provided in the housing 104 of the optical modulator 100 in addition to the signal lead pins 120, 122, 124, and 126, for example, by using solder.

According to this, in the FPC 106, the additional through-holes 240 and 242 instead of the signal through-holes 220 and 226 become fixed ends of two cantilever beam portions in which the two sides 204 and 206 are set as free ends, and lengths of arms of the cantilever beam portions become L4 and L5 which are shorter than L1. Accordingly, a natural peripheral frequency of the beam portions becomes higher in comparison to a case where the additional through-holes 240 and 242 are not provided.

As a result, the natural vibration frequency of the two cantilever beam portions, in which the sides 204 and 206 are respectively set as free ends, deviates from a frequency range of environmental vibration, and thus vibration of the sides 204 and 206, which is caused by the environmental vibration, is suppressed. As a result, occurrence of peeling-off or cracks of a solder-fixing portion or a solder-connecting portion, which are caused by the environmental vibration, is suppressed.

Furthermore, a plurality of the additional through-holes may be provided respectively between the signal through-hole 220 and the side 204, and between the signal through-hole 226 and the side 206. In this case, the natural vibration frequency of the cantilever beam portions, in which the sides 204 and 206 are respectively set as free ends, is determined in accordance with a distance between each of the additional through-holes disposed at positions closest to the sides 204 and 206 and the sides 204 and 206.

That is, the optical modulator 100 having the above-described configuration includes the flexible printed circuit (FPC) 106 that performs electrical connection between the optical modulator 100 and the circuit substrate, and the additional through-holes 240 and 242, which are additional patterns, are respectively provided between the signal through-holes 220 and 226 which are ends of the arrangement portion of the signal through-holes 220, 222, 224, and 226 which are signal patterns, and the sides 204 and 206 which are close to the signal through-holes 220 and 226 in addition to a fixing portion that is provided when the signal through-holes 220, 222, 224, and 226 of the FPC 106 and the signal lead pins 120, 122, 124, and 126 of the optical modulator 100 are respectively connected to each other. In addition, the additional through-holes 240 and 242 are connected to the additional lead pins 132 and 130 which are provided in the optical modulator 100, and thus additional fixing portions are provided in the FPC 106.

According to this, in the optical modulator 100, the distances L4 and L5 from the sides 204 and 206 to the additional through-holes 240 and 242 are adjusted to deviate the natural vibration frequency of vibration of cantilever beams, in which the sides 204 and 206 are set as free ends, from a frequency range of environmental vibration so as to shift the natural vibration frequency toward a higher side. Accordingly, vibration of the FPC 106 which is caused by the environmental vibration is suppressed, and thus it is possible to suppress the occurrence of peeling-off or cracks of a solder-fixing portion or a solder-connecting portion.

In addition, the additional fixing portions are provided by fixing the additional through-holes 240 and 242 provided in the FPC 106, and the additional lead pins 132 and 130 provided in the optical modulator 100 by using solder (a conductive material other than solder is also possible). For example, it is possible to simultaneously form the signal lead pins 120, 122, 124, and 126 and the signal through-holes 220, 222, 224, and 226 during solder-fixing work. Accordingly, it is possible to reduce the number of manufacturing processes of the additional fixing portions. In addition, when the additional fixing portions are solder-fixed in advance, a positional relationship between the signal lead pins 120, 122, 124, and 126 and the signal through-holes 220, 222, 224, and 226 is fixed, and thus solder-fixing work therebetween becomes easy, and finished quality of the solder-fixing portions is also improved.

In addition, design (a size, a shape, and the like) of the additional lead pins 130 and 132, and the additional through-holes 240 and 242 can be made in the same manner as the design of the signal lead pins 120, 122, 124, and 126 and the signal through-holes 220, 222, 224, and 226. Accordingly, the amount of solder between respective lead pins and respective through-holes, heating conditions, and the like can be unified during manufacturing, and thus it is also advantageous from the viewpoints of manufacturing line work.

In addition, when the lengths L4 and L5 are set to be different from each other, natural vibration frequencies of vibration of cantilever beams, in which the sides 204 and 206 are respectively set as free end, become different from each other. Accordingly, even though a frequency range of environmental vibration diffuses up to the natural vibration frequencies, it is possible to suppress portion of the sides 204 and 206 from simultaneously vibrating with respect to the same environmental frequency, and thus it is possible to further enhance resistance of the optical modulator 100 against the environmental vibration.

Next, modification examples of this embodiment will be described with reference to FIG. 4 to FIG. 11. FPCs to be described below can be used in the optical modulator 100 instead of the FPC 106. Furthermore, in the following modification examples, it is assumed that the housing 104 of the optical modulator 100 is provided with additional lead pins which are connected and fixed to additional through-holes provided in the FPCs of the modification examples, but modification examples of the housing 104 in which the additional lead pins corresponding to individual modification examples is not illustrated to avoid redundant description in the drawings for easy understanding.

In addition, in the following description of the modification examples, a portion between the signal through-holes 220, 222, 224, and 226 and the pads 210, 212, 214, and 216 is also referred to as "double-supported beam" or "double-supported beam portion". In addition, a cantilever beam portion, in which the side 204 or a modification (notched portion edge and the like) thereof is set as a free end, is also referred to as "first cantilever beam" or "first cantilever beam portion", and vibration of the first cantilever beam portion is also referred to as "first cantilever beam vibration". Similarly, a cantilever beam portion, in which the side 206 or a modification (notched portion edge and the like) thereof is set as a free end, is also referred to as "second cantilever beam" or "second cantilever beam portion", and vibration of the second cantilever beam portion is also referred to as "second cantilever beam vibration". In addition, a cantilever beam portion, in which the side 202 is set as a free end, is also referred to as "third cantilever beam" or "third cantilever beam portion", and vibration of the third cantilever beam portion is also referred to as "third cantilever beam vibration".

First Modification Example

First, description will be given of a first modification example of the FPC 106 that is used in the optical modulator 100 illustrated in FIG. 1A.

In the FPC 106 illustrated in FIG. 2, additional fixing portions formed by the additional lead pins 130 and 132 and the additional through-holes 240 and 242 are provided to increase the natural vibration frequency of cantilever beam vibration in which the sides 204 and 206 are set as free ends, thereby suppressing vibration of the FPC 106 which is caused by environmental vibration.

In contrast, in this modification example, connecting portions between the signal through-holes 220, 222, 224, and 226 and the signal lead pins 120, 122, 124, and 126 are set as a fixed end on one side, and connecting portions between the pads 210, 212, 214, and 216 and the circuit substrate are set as a fixed end on the other side, thereby raising the natural vibration frequency of double-supported beam portion that is constructed between the fixed ends. Specifically, at least one additional fixing portion, which includes an additional through-hole to which additional lead pins is connected, is formed between the arrangement portion of the signal through-holes 220, 222, 224, and 226 to which the signal lead pins 120, 122, 124, and 126 are respectively connected, and the one side 200 in which the pads 210, 212, 214, and 216 are provided.

Figure 4:
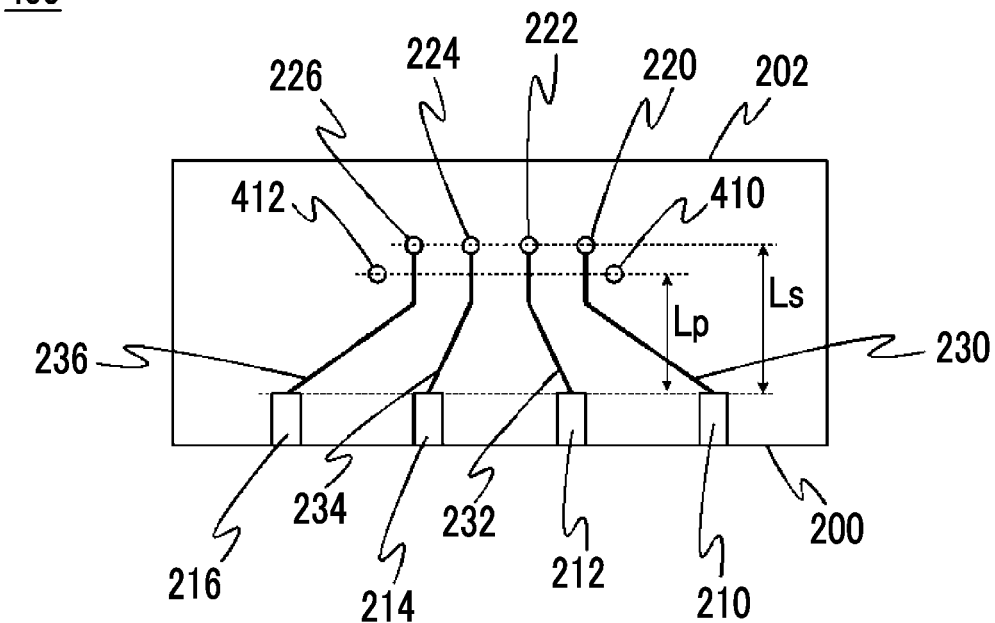
FIG. 4 is a view illustrating a first modification example of the FPC that is used in the optical modulator illustrated in FIG. 1A.

FIG. 4 is a view illustrating a configuration of an FPC 400, which can be used instead of the FPC 106, according to this modification example. Furthermore, in FIG. 4, the same reference numerals as in FIG. 2 will be given to the same constituent elements as in the FPC 106 illustrated in FIG. 2, and the description for FIG. 2 will be cited.

The FPC 400 illustrated in FIG. 4 has the same configuration as that of the FPC 106 illustrated in FIG. 2 except that the additional through-holes 240 and 242 are not provided, and additional through-holes 410 and 412 are provided between the arrangement portion of the signal through-holes 220, 222, 224, and 226 to which the signal lead pins 120, 122, 124, and 126 are respectively connected, and ends, which are opposite to the side 200, of the pads 210, 212, 214, and 216 provided in the one side 200. In addition, the additional through-holes 410 and 412 are fixed to additional lead pins which are provided in the housing 104 of the optical modulator 100, thereby constructing additional fixing portions (in addition, in the following description, so as to avoid redundant description for easy understanding, the "additional through-holes" represent through-holes to which corresponding "additional lead pins" are connected, thereby constructing additional fixing portions).

In this modification example, a distance Lp from the ends, which are opposite to the side 200, of the pads 210, 212, 214, and 216 provided in the side 200 to the additional through-holes 410 and 412 of additional fixing portions is set to be shorter than a distance Ls from the ends to the signal through-holes 220, 222, 224, and 226. That is, a distance between two fixed ends, which constitute a double-supported beam portion of the FPC 400, becomes Lp shorter than Ls, and thus the natural vibration frequency of the double-supported beam portion is shifted to a higher side beyond the frequency range of environmental vibration, thereby suppressing vibration of the FPC 400 which is caused by the environmental vibration. As a result, it is possible to suppress the occurrence of peeling-off or cracks of the solder-fixing portion or the solder-connecting portion of the signal through-holes 220, 222, 224, and 226, and the solder-fixing portion or the solder-connecting portion of the pads 210, 212, 214, and 216.

Furthermore, the number of the additional through-holes which are provided between the arrangement portion of the signal through-holes 220, 222, 224, and 226 and the pads 210, 212, 214, and 216 is not limited to two, that is, the additional through-holes 410 and 412 as in this embodiment, and may be set to an arbitrary number of at least one or more. However, in a case where only one or two or more additional through-holes are provided, as in the FPC 400 illustrated in FIG. 4, it is preferable that the additional through-hole is provided in the vicinity of one or both of the signal through-holes 220 and 226 at respective ends, which are most susceptible to vibration, in the arrangement of the signal through-holes 220, 222, 224, and 226.

In addition, in a case where a plurality of additional through-holes are provided, distances between the additional through-holes and ends, which are opposite to the side 200, of the pads 210, 212, 214, and 216 are set to be different from each other. According to this, it is possible to disperse the natural vibration frequency of the double-supported beam portion formed by the FPC 400 in a state in which the additional through-holes and the pads 210, 212, 214, and 216 are set as two fixed ends along a direction of the side 200. According to this, even though the environmental vibration matches one natural vibration frequency, it is possible to avoid a situation in which the entirety of the double-supported beam portion with a direction of the side 200 set as a width uniformly vibrates, and thus it is possible to further enhance resistance of the optical modulator 100 against the environmental vibration.

Second Modification Example

Next, description will be given of a second modification example of the FPC 106 that is used in the optical modulator 100 illustrated in FIG. 1A.

In this modification example, in addition to the configuration of the FPC 400 according to the first modification example as illustrated in FIG. 4, at least one additional through-hole is also provided between the arrangement portion of the signal through-holes 220, 222, 224, and 226 and the other side 202 so as to increase the natural vibration frequency of cantilever beam vibration in which the other side 202 (that is, the side 202 on a side in which the signal through-holes 220, 222, 224, and 226 are provided), which is opposite to the one side 200 in which the pads 210, 212, 214, and 216 are provided, is set as a free end.

Figure 5:
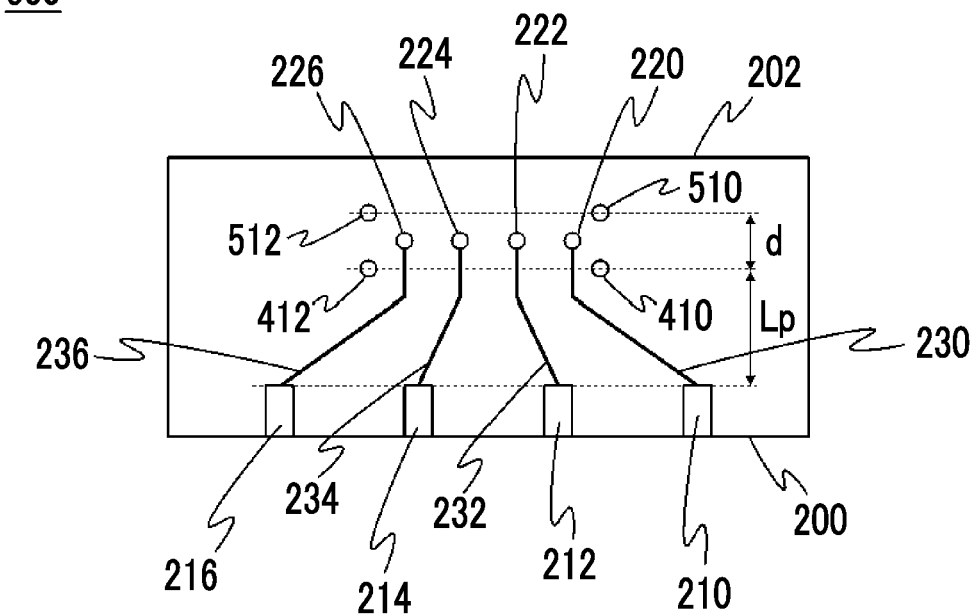
FIG. 5 is a view illustrating a second modification example of the FPC that is used in the optical modulator illustrated in FIG. 1A.

FIG. 5 is a view illustrating a configuration of an FPC 500, which can be used instead of the FPC 106, according to this modification example. Furthermore, in FIG. 5, the same reference numerals as in FIG. 2 and FIG. 4 will be given to the same constituent elements as in the FPC 106 illustrated in FIG. 2 and the FPC 400 illustrated in FIG. 4, and the description for FIG. 2 and FIG. 4 will be cited.

The FPC 500 illustrated in FIG. 5 has the same configuration as that of the FPC 400 illustrated in FIG. 4 except that additional through-holes 510 and 512 are further provided between the arrangement portion of the signal through-holes 220, 222, 224, and 226 to which the signal lead pins 120, 122, 124, and 126 are connected, and the side 202 that is opposite to the one side 200 in which the pads 210, 212, 214, and 216 are provided. The additional through-holes 510 and 512 are fixed to additional lead pins which are provided in the housing 104 of the optical modulator 100, thereby constructing additional fixing portions.

In this modification example, as in the FPC 400, it is possible to increase the natural vibration frequency of a portion (double-supported beam portion) of the FPC 500 between the pads 210, 212, 214, and 216 and the signal through-holes 220, 222, 224, and 226 due to the additional through-holes 410 and 412. In addition to this, it is possible to increase the natural vibration frequency of a portion of a cantilever beam (third cantilever beam) portion with the side 202 set as a free end due to the additional through-holes 510 and 512. In addition, in this modification example, the additional through-holes 410 and 510 are disposed on the side 204 side in comparison to the signal through-hole 220 that is located at a right end of the arrangement portion of the signal through-holes 220, 222, 224, and 226 in the drawing. In addition, the additional through-holes 412 and 512 are disposed on the side 206 side in comparison to the signal through-hole 226 that is located at a left end of the arrangement portion in the drawing. According to this, in this modification example, as in the FPC 106 illustrated in FIG. 2, it is also possible to increase the natural vibration frequency of the first and second cantilever beam portions in which the sides 204 and 206 are respectively set as free ends. That is, the FPC 500 illustrated in FIG. 5 has an efficient and effective configuration capable of raising the entirety of natural vibration frequencies of the four vibration modes (vibration of the double-supported beam, and three kinds of vibration of the first to third cantilever beams) due to the four additional through-holes 410, 412, 510, and 512.

Furthermore, in a case where a distance d, which is measured along a direction perpendicular to the side 200 in which the pads 210, 212, 214, and 216 are provided, between the additional through-holes 410 and 412 and the additional through-holes 510 and 512, is too short, the additional through-holes 410, 412, 510, and 512, and the signal through-holes 220, 222, 224, and 226 are too close to each other. Therefore, an effect of protecting a solder-fixing portion or a solder-connecting portion of the signal through-holes 220, 222, 224, and 226 against stress caused by vibration of the FPC 500 may be weakened.

On the other hand, when the distance d is too long, the signal through-holes 220, 222, 224, and 226 and the additional through-holes 410, 412, 510, and 512 are too spaced away from each other. Therefore, for example, the double-supported beam vibration, which occurs between the additional through-holes 410 and 412, and the pads 210, 212, 214, and 216 may be transmitted toward the signal through-holes 220, 222, 224, and 226 in a state in which the additional through-holes 410 and 412 are set as a supporting point. That is, in a relationship between the distance d and the distance Lp between the additional through-holes 410 and 412 and the pads 210, 212, 214, and 216, an optimal range may exist.

FIG. 6 illustrates an evaluation result for the degree of occurrence of peeling-off or cracks of the solder-fixing portion or the solder-connecting portion of the signal lead pins 120, 122, 124, and 126 after having vibration and impact at various distances d normalized by the distance Lp. Evaluation (⊚: very good, o: good, Δ: insufficient, x: bad) in FIG. 6 is determined on the basis of "quality criteria in the micro soldering technology certification and verification test" (JWES-MS060801J) enacted by Japan Welding Engineering Society in consideration of finish uniformity. The quality criteria is based on the quality standards of high-reliability apparatus described in JISC 61191 "Printed board assemblies", and partially, quality criteria are more specifically defined in comparison to JIS-required standards.

From the result illustrated in FIG. 6, it can be seen that in a case where the normalization distance d/Lp is smaller than ⅕, an effect is not sufficient. Accordingly, it is preferable to dispose the additional through-holes 410, 412, 510, and 512 to satisfy at least a relationship of d≥Lp/5, and more preferably a relationship of ½≤d/Lp≤1.5.

Furthermore, in the FPC 500 illustrated in FIG. 5, the additional through-holes 510 and 512, and the additional through-holes 410 and 412 are disposed at vertically symmetric positions in the drawing with the signal through-holes 220, 222, 224, and 226 interposed therebetween, but the additional through-holes may be disposed in an asymmetric manner with the signal through-holes 220, 222, 224, and 226 interposed therebetween without limitation thereto. However, as illustrated in FIG. 5, in a case where the additional through-holes are disposed at the symmetric positions, it is easy to stably attach the FPC 500 to the housing 104 of the optical modulator 100. Accordingly, in each solder-fixing portion or solder-connecting portion between the signal through-holes 220, 222, 224, and 226 and the signal lead pins 120, 122, 124, and 126, it is possible to suppress a variation of a positional relationship between a through-hole and a lead pin which correspond to each other or a manufacturing variation such as the amount of solder. As a result, it is easy to make radio-frequency characteristics of electrical line formed by the signal through-holes 220, 222, 224, and 226 be the same as each other.

Third Modification Example

Next, description will be given of a third modification example of the FPC 106 that is used in the optical modulator 100 illustrated in FIG. 1A.

This modification example has the same configuration as in the second modification example illustrated in FIG. 5 except that a plurality of additional through-holes provided between the arrangement portion of the signal through-holes 220, 222, 224, and 226 and the one side 200 in which the pads 210, 212, 214, and 216 are provided, and additional through-holes provided between the arrangement portion and the side 202 opposite to the side 200 are disposed to surround the signal through-holes 220, 222, 224, and 226 from all directions.

FIG. 7 is a view illustrating a configuration of an FPC 700, which can be used instead of the FPC 106, according to this modification example. Furthermore, in FIG. 7, the same reference numeral as in FIG. 2 will be given to the same constituent element as in the FPC 106 illustrated in FIG. 2, and the description for FIG. 2 will be cited.

The FPC 700 illustrated in FIG. 7 has the same configuration as that of the FPC 106 illustrated in FIG. 2 except that the additional through-holes 240 and 242 are not provided, and additional through-holes 710, 712, 714, 716, and 718 are provided between the arrangement portion of the signal through-holes 220, 222, 224, and 226 to which the signal lead pins 120, 122, 124, and 126 are respectively connected, and the one side 200 in which the pads 210, 212, 214, and 216 are provided.

In addition, additional through-holes 720, 722, 724, 726, and 728 are provided between the arrangement portion and the side 202 opposite to the side 200. In addition, the additional through-holes 710, 712, 714, 716, 718, 720, 722, 724, 726, and 728 are disposed to surround the signal through-holes 220, 222, 224, and 226 from all directions.

That is, the signal through-hole 220 is surrounded by the additional through-holes 710, 712, 720, and 722 from all directions. The signal through-hole 222 is surrounded by the additional through-holes 712, 714, 722, and 724 from all directions. The signal through-hole 224 is surrounded by the additional through-holes 714, 716, 724, and 726 from all directions. The signal through-hole 226 is surrounded by the additional through-holes 716, 718, 726, and 728 from all directions.

In this modification example, the additional through-holes 710, 712, 714, 716, 718, 720, 722, 724, 726, and 728 are disposed at positions surrounding the signal through-holes 220, 222, 224, and 226 from all directions. According to this, in this modification example, the solder-fixing portion or the solder-connecting portion in each of the signal through-holes 220, 222, 224, and 226 is protected from vibration in all directions at peripheral portions of the signal through-holes. In addition, it is possible to increase the entirety of natural vibration frequencies of four vibration modes (that is, double-supported beam vibration in which the pad 210, 212, 214, or 216 is set as one fixed end, and three kinds of first to third cantilever beam vibration in which the sides 202, 204, and 206 are respectively set as free ends) in the FPC 700 due to the additional through-holes 710, 712, 714, 716, 718, 720, 722, 724, 726, and 728. As a result, it is possible to reduce an influence of environmental vibration.

In addition, since the additional through-holes 710, 712, 714, 716, 718, 720, 722, 724, 726, and 728 are symmetrically disposed centering around each of the signal through-holes 220, 222, 224, and 226, it is easy to stably attach the FPC 700 to the housing 104 of the optical modulator 100. According to this, a variation of the solder-fixing portion or the solder-connecting portion between the signal lead pins 120, 122, 124, and 126 and the signal through-holes 220, 222, 224, and 226 disappears in (between) the signal through-holes 220, 222, 224, and 226. As a result, with regard to radio-frequency characteristics of electrical lines including the signal through-holes 220, 222, 224, and 226 (electrical lines including each of the signal lead pins 120, 122, 124, and 126, each of the signal through-holes 220, 222, 224, and 226, each of the wiring patterns 230, 232, 234, and 236, and each of the pads 210, 212, 214, and 216), it is easy to make a difference in the radio-frequency characteristics between the electrical lines be small and the same in each case.

Fourth Modification Example

Next, description will be given of a fourth modification example of the FPC 106 that is used in the optical modulator 100 illustrated in FIG. 1A.

FIG. 8 is a view illustrating a configuration of an FPC 800, which can be used instead of the FPC 106, according to this modification example. Furthermore, in FIG. 8, the same reference numerals as in FIG. 2 and FIG. 7 will be given to the same constituent elements as in the FPC 106 illustrated in FIG. 2 and the FPC 700 illustrated in FIG. 7, and the description for FIG. 2 and FIG. 7 will be cited.

The FPC 800 illustrated in FIG. 8 has the same configuration as that of the FPC 106 illustrated in FIG. 7 except that notched portions 810 and 812 are respectively provided from the two sides 204 and 206 excluding the one side 200 in which the pads 210, 212, 214, and 216 are provided, and the other side 202 opposite to the one side 200 toward the arrangement portion of the signal through-holes 220, 222, 224, and 226.

In this modification example, in addition to a configuration exhibiting the same effect as in the third modification example illustrated in FIG. 7, since the notched portions are respectively provided in the sides 204 and 206, the natural vibration frequency of vibration of a first cantilever beam provided on a right side in the drawing in a state in which the additional through-holes 710 and 720 are set as fixed ends, and the natural vibration frequency of vibration of a second cantilever beam provided on a left side in the drawing in a state in which the additional through-holes 718 and 728 are set as fixed ends greatly shift with respect to a high frequency in comparison to the FPC 700 illustrated in FIG. 7. According to this, occurrence of peeling-off or cracks of the solder-fixing portion or the solder-connecting portion in the signal through-holes 220 and 226 due to vibration of the first and second cantilever beams is greatly suppressed.

Particularly, in this modification example, depths of the notched portions 810 and 812 are different from each other, and a distance L7 between the additional through-holes 710 and 720 and an end of the notched portion 810 provided from the side 204 is shorter than a distance L6 between the additional through-holes 718 and 728 and an end of the notched portion 812 provided from the side 206.

According to this, the natural vibration frequency of the first cantilever beam vibration in which the additional through-holes 710 and 720 are set as fixed ends, and the natural vibration frequency of the second cantilever beam vibration in which the additional through-holes 718 and 728 are set as fixed ends are different from each other. As a result, even though a frequency range of environmental vibration diffuses up to the natural vibration frequencies, it is possible to suppress the first cantilever beam vibration and the second cantilever beam vibration from simultaneously occurring at a large amplitude with respect to the same environmental frequency, and thus it is possible to further enhance resistance of the optical modulator 100 against the environmental vibration.

Furthermore, the notched portions 810 and 812 may extend up to the side 202 to be provided in a shape obtained by respectively cutting-out a corner between the side 202 and the side 204, and a corner between the side 202 and the side 206 in a rectangular shape.

Fifth Modification Example

Next, description will be given of a fifth modification example of the FPC 106 that is used in the optical modulator 100 illustrated in FIG. 1A.

Figure 9:
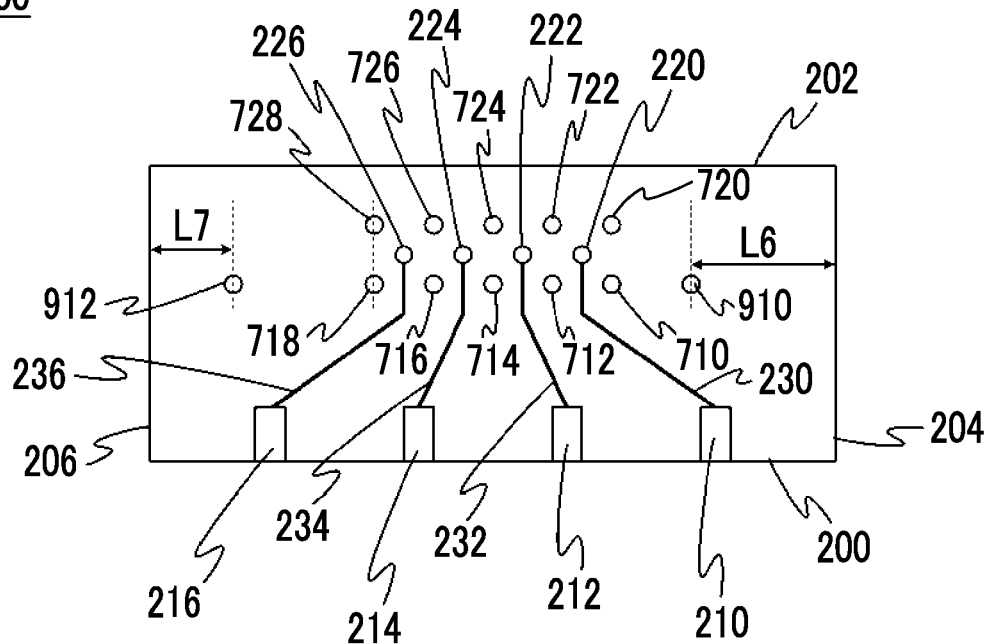
FIG. 9 is a view illustrating a fifth modification example of the FPC that is used in the optical modulator illustrated in FIG. 1A.

FIG. 9 is a view illustrating a configuration of an FPC 900, which can be used instead of the FPC 106, according to this modification example. Furthermore, in FIG. 9, the same reference numerals as in FIG. 2 and FIG. 7 will be given to the same constituent elements as in the FPC 106 illustrated in FIG. 2 and the FPC 700 illustrated in FIG. 7, and the description for FIG. 2 and FIG. 7 will be cited.

The FPC 900 illustrated in FIG. 9 has the same configuration as that of the FPC 700 illustrated in FIG. 7 except that additional through-holes 910 and 912 are respectively provided between the additional through-holes 710 and 718 located at respective ends of the arrangement of the additional through-holes 710, 712, 714, 716, and 718 provided between the signal through-holes 220, 222, 224, and 226 and the one side 200 in which the pads 210, 212, 214, and 216 are provided, and two sides 204 and 206 excluding the one side 200 and the side 202 opposite to the one side 200.

In this modification example, in addition to a configuration exhibiting the same effect as in the third modification example illustrated in FIG. 7, since the additional through-holes 910 and 912 are respectively provided between the additional through-holes 710 and 718 located at respective ends of the arrangement of the additional through-holes 710, 712, 714, 716, and 718, and the sides 204 and 206. As a result, the natural vibration frequency of the first cantilever beam vibration and the second cantilever beam vibration, in which the sides 204 and 206 are respectively set as free ends, further shifts with respect to a high frequency in comparison to the configuration illustrated in FIG. 7. According to this, occurrence of peeling-off or cracks of the solder-fixing portion or the solder-connecting portion in the signal through-holes 220 and 226 due to vibration of the first and second cantilever beams is greatly suppressed.

Particularly, in this modification example, a distance L6 between the side 204 and the additional through-hole 910, and a distance L7 between the side 206 and the additional through-hole 912 are different from each other, and thus the natural vibration frequency of the first cantilever beam vibration in which the side 204 is set as a free end and the natural vibration frequency of the second cantilever beam vibration in which the side 206 are set as a free end are different from each other. According to this, in this modification example, even though a frequency range of environmental vibration diffuses up to the natural vibration frequencies, it is possible to suppress the first cantilever beam vibration and the second cantilever beam vibration from simultaneously occurring at a large amplitude with respect to the same environmental frequency, and thus it is possible to further enhance resistance of the optical modulator 100 against the environmental vibration.

This modification example can be used instead of the FPC 800 illustrated in FIG. 8, for example, in a case where it is difficult to provide a large notched portion in the FPC from a restriction of electrical line disposition in the FPC, a restriction of an FPC attaching jig, and the like.

Furthermore, in the configuration illustrated in FIG. 9, the same notched portions as the notched portions 810 and 812 illustrated in FIG. 8 may be provided to further raise the natural vibration frequency of the cantilever beam vibration so as to further enhance resistance of the optical modulator 100 with respect to environmental vibration.

Sixth Modification Example

Next, description will be given of a sixth modification example of the FPC 106 that is used in the optical modulator 100 illustrated in FIG. 1A.

Figure 10:
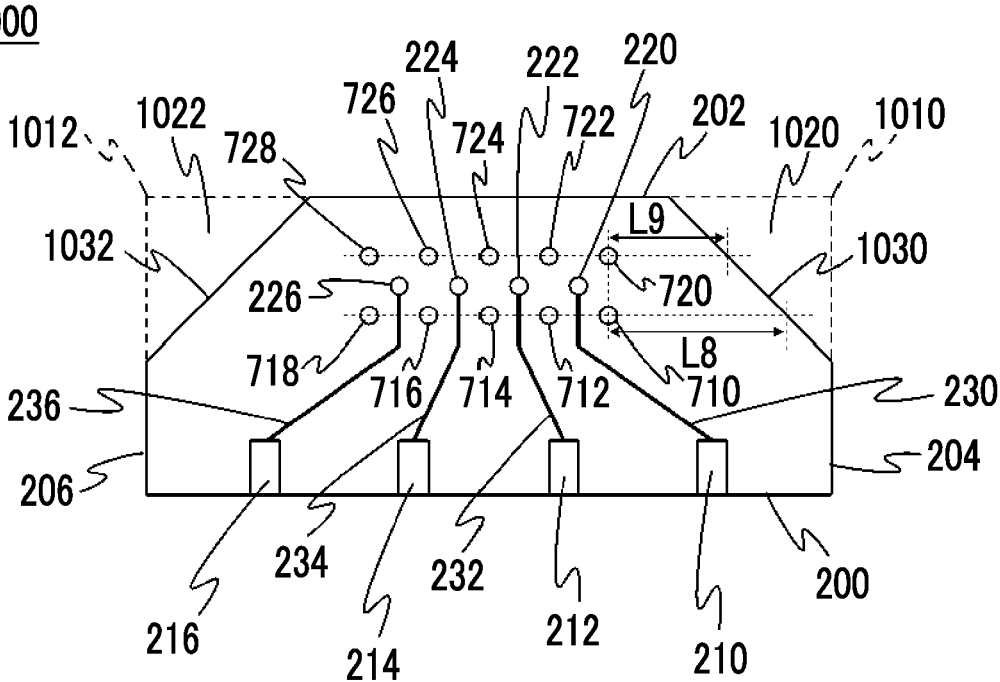
FIG. 10 is a view illustrating a sixth modification example of the FPC that is used in the optical modulator illustrated in FIG. 1A.

FIG. 10 is a view illustrating a configuration of an FPC 1000, which can be used instead of the FPC 106, according to this modification example. Furthermore, in FIG. 10, the same reference numerals as in FIG. 2 and FIG. 7 will be given to the same constituent elements as in the FPC 106 illustrated in FIG. 2 and the FPC 700 illustrated in FIG. 7, and the description for FIG. 2 and FIG. 7 will be cited.

The FPC 1000 illustrated in FIG. 10 has the same configuration as that of the FPC 700 illustrated in FIG. 7 except that notched portions 1020 and 1021 are respectively provided in two corners 1010 and 1012 made by two sides 204 and 206 excluding the one side 200 in which the pads 210, 212, 214, and 216 are provided and the other side 202 opposite to the one side 200, and the other side 202. In addition, the notched portions 1020 and 1021 are provided so that a distance, which is measured along a direction of the side 200, from the additional through-holes 710, 720, 718, and 728 which are located at respective ends of the arrangement portion of the additional through-holes 710, 712, 714, 716, 718, 720, 722, 724, 726, and 728 to edges 1030 and 1032 of the notched portions 1020 and 1021 varies in accordance with a distance from the one side 200. For example, the notched portion 1020 is configured so that a distance, which is measured along a direction of the side 200, from the additional through-holes 710 and 720 to the edge 1030 is shortened as it is spaced away from the side 200. In addition, a distance L9 at a position of the additional through-hole 720, which is further spaced away from the side 200 in comparison to the additional through-hole 710, is shorter than a distance L8 at a position in which the additional through-hole 710 is provided.

In this modification example, since the notched portion 1020 is provided so that the distance, which is measured along a direction of the side 200, from the additional through-holes 710 and 720 to the edge 1030 of the notched portion 1020 varies in accordance with a distance from the side 200, the natural vibration frequency of the first cantilever beam provided on a right side in the drawing in a state in which the additional through-holes 710 and 720 are set as fixed ends varies in accordance with a distance from the side 200. According to this, the natural vibration frequency of the first cantilever beam vibration in which the edge 1030 is set as a free end is distributed in a finite frequency range, and thus a vibration amplitude of the cantilever beam vibration, which occurs due to environmental vibration, is greatly suppressed. In addition, from the same principle, the natural vibration frequency of the second cantilever beam vibration in which the edge 1032 is set as a free end is also distributed in a finite frequency range, and thus a vibration amplitude of the cantilever beam vibration, which occurs due to environmental vibration, is greatly suppressed.

Accordingly, in the FPC 1000 according to this modification example, peeling-off or cracks of the solder-fixing portion or the solder-connecting portion of the signal through-holes 220, 222, 224, and 226 along vibration of a first and second cantilever beam portions, which are respectively provided on a right side and on a left side in the drawing in a state in which the additional through-holes 710, 720, 718, and 728 are respectively set as fixed ends, are effectively suppressed.

In addition, typically, in a case of preparing individual FPCs by punching an FPC base material, deformation is likely to occur in a corner, which forms a right angle or an acute angle, of the individual FPCs. According to this, for example, in a case of preparing the FPC 800 including a plurality of corners as illustrated in FIG. 8, a deformation site increases. In contrast, in the FPC 1000 of this modification example, since the notched portions 1020 and 1032 are respectively provided in the corners 1010 and 1012 which form a right angle, the right-angle corners 1010 and 1012 are respectively substituted with two shapes which form an obtuse angle. Accordingly, even in a case of preparing the FPC 1000 through punching, deformation is less likely to occur in the corners.

Seventh Modification Example

Next, description will be given of a seventh modification example of the FPC 106 that is used in the optical modulator 100 illustrated in FIG. 1A.

Figure 11:
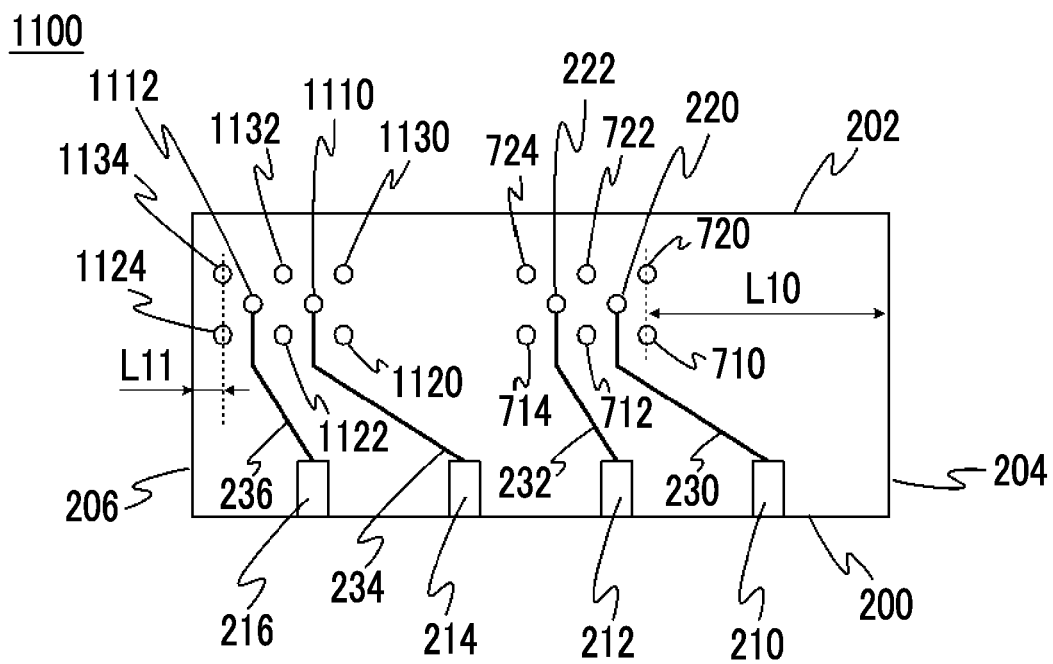
FIG. 11 is a view illustrating a seventh modification example of the FPC that is used in the optical modulator illustrated in FIG. 1A.

FIG. 11 is a view illustrating a configuration of an FPC 1100, which can be used instead of the FPC 106, according to this modification example. Furthermore, in FIG. 11, the same reference numerals as in FIG. 2 and FIG. 7 will be given to the same constituent elements as in the FPC 106 illustrated in FIG. 2 and the FPC 700 illustrated in FIG. 7, and the description for FIG. 2 and FIG. 7 will be cited.

The FPC 1100 illustrated in FIG. 11 has the same configuration as that of the FPC 106 illustrated in FIG. 2 and the FPC 700 illustrated in FIG. 7 except that the arrangement portion of signal through-holes are divided into two parts. Specifically, signal through-holes 1110 and 1112, which are disposed at positions moved from positions of the signal through-holes 224 and 226 in a left direction in the drawing, are provided instead of the signal through-holes 224 and 226 which are symmetric to the signal through-holes 220 and 222 on the basis of a right and left central line of the FPC 106. According to this, the arrangement portion of signal through-holes includes two arrangement portions, that is, an arrangement portion in which the signal through-holes 220 and 222 are arranged, and an arrangement portion in which the signal through-holes 1110 and 1112 are arranged.

In addition, additional through-holes 1122, 1124, 1132, and 1134, which are disposed at positions moved from positions of the additional through-holes 716, 718, 726, and 728 in a left direction in the drawing, are provided instead of the additional through-holes 716, 718, 726, and 728 of the FPC 700 illustrated in FIG. 7. In addition, additional through-holes 1120 and 1130 are provided, and the additional through-holes 1120, 1122, 1124, 1130, 1132, and 1134 are disposed at positions which surround the signal through-holes 1110 and 1112 from all directions.

Furthermore, in a case where the FPC 1100 is used in an optical modulator, as a modification of the optical modulator 100, it is necessary to provide signal lead pins in a housing of the optical modulator at positions corresponding to the signal through-holes 220, 222, 1110, and 1112.

In this modification example, the arrangement portion of the signal through-holes includes two arrangement portions, that is, the arrangement portion of the signal through-holes 220 and 222, and the arrangement portion of the signal through-holes 1110 and 1112. In addition, as described above, the signal through-holes 1110 and 1112 are provided at positions which move in a left direction in the drawing from positions symmetric to positions of the signal through-holes 220 and 222 on the basis of the right and left central line. As a result, in this modification example, a distance L11 between the additional through-holes 1124 and 1134 which surround the signal through-hole 1112 from a left side in the drawing, and the side 206 is shorter than a distance L10 between the additional through-holes 710 and 720 which surround the signal through-hole 220 from a right side in the drawing, and the side 204.

According to this, in this modification example, the natural vibration frequency of the second cantilever beam vibration in which the side 206 is set as a free end, and the natural vibration frequency of the first cantilever beam vibration in which the side 204 is set as a free end become different from each other. Accordingly, even though a frequency range of environmental vibration diffuses up to the natural vibration frequencies, it is possible to suppress the first cantilever beam vibration and the second cantilever beam vibration from simultaneously occurring at a large amplitude with respect to the same environmental frequency, and thus it is possible to further enhance resistance of the optical modulator 100 against the environmental vibration.

In addition, in this modification example, the additional through-holes 710, 712, 714, 720, 722, 724, 1120, 1122, 1124, 1130, 1132, and 1134 are provided at positions which respectively surround the signal through-holes 220, 222, 1110, and 1112 from all directions. According to this, as in the FPC 700 illustrated in FIG. 7, the solder-fixing portion or the solder-connecting portion in each of the signal through-holes 220, 222, 1110, and 1112 is protected from vibration from all direction at peripheral portions of the signal through-holes. In addition, the entirety of natural vibration frequencies of four vibration modes (vibration of a double-supported beam portion, and three kinds of vibration of first to third cantilever beam portions) in the FPC 1100 are raised due to the additional through-holes 710, 712, 714, 720, 722, 724, 1120, 1122, 1124, 1130, 1132, and 1134. As a result, it is possible to reduce an influence of environmental vibration.

Furthermore, in the above-described FPCs 106, 400, 500, 700, 800, 900, 1000, and 1100, a ground pattern (not illustrated) provided in each of the FPCs may be connected to a housing ground of the optical modulator 100 (or a modification thereof) by an additional through-hole (240 and the like) and an additional lead pin (132 and the like). According to this, a fluctuation of a ground potential in each of the FPCs is effectively suppressed, and thus it is possible to obtain stable radio-frequency transmission characteristics and reflective characteristics.

Second Embodiment

Next, description will be given of a second embodiment of the invention. This embodiment relates to an optical transmission apparatus on which the optical modulator 100 (including arbitrary modification examples illustrated in FIG. 4 to FIG. 11) according to the first embodiment is mounted.

Figure 12:
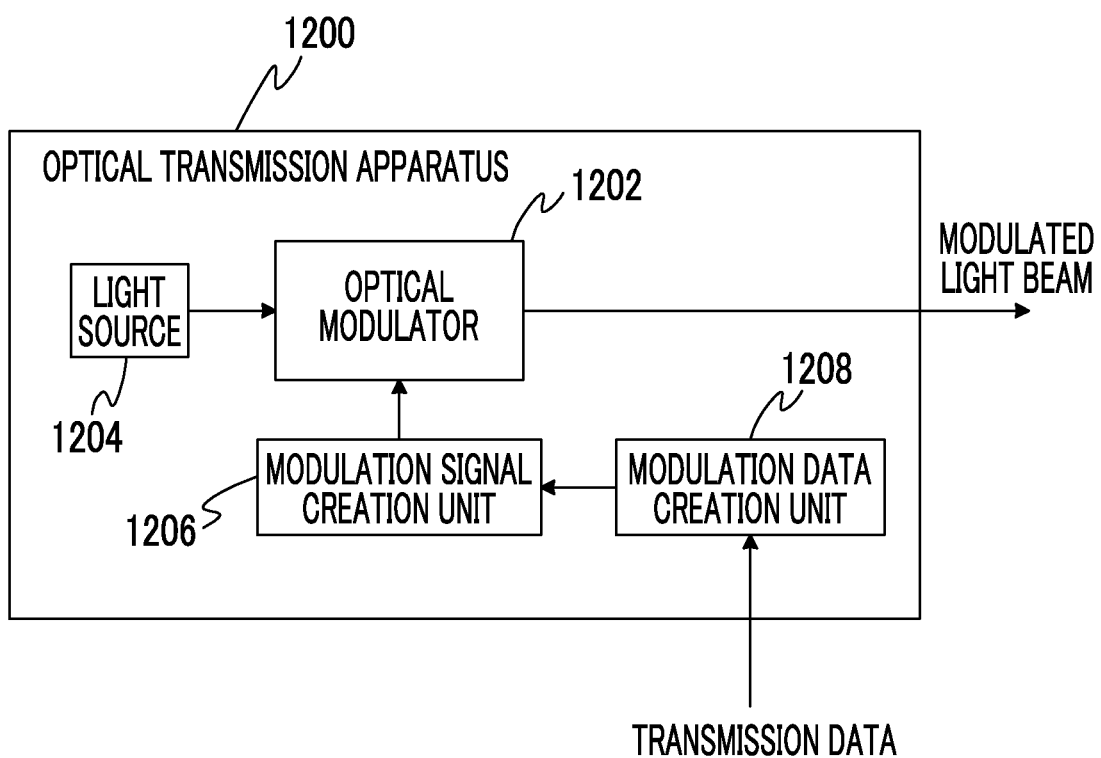
FIG. 12 is a view illustrating a configuration of an optical transmission apparatus according to a second embodiment of the invention.
Figure 13A:
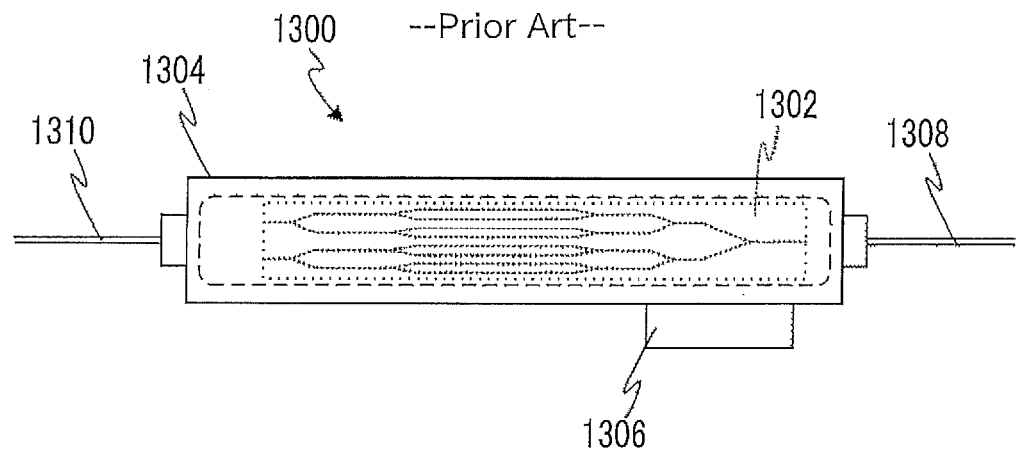
FIG. 13A is a top view of an optical modulator in the related art.
Figure 13B:
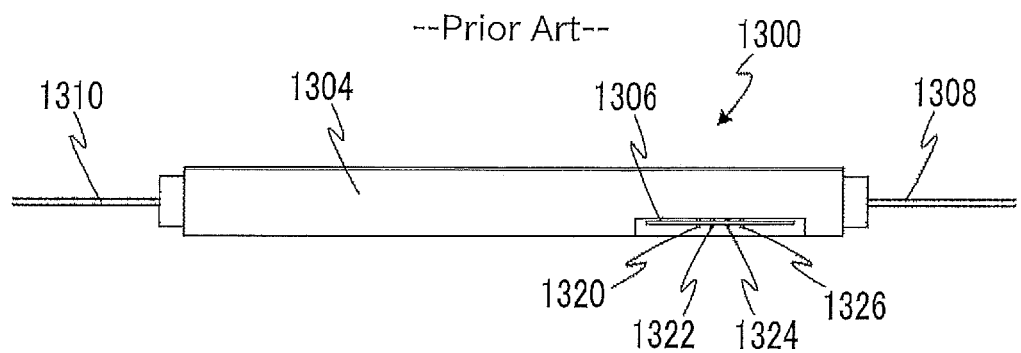
FIG. 13B is a side view of the optical modulator in the related art.
Figure 13C:
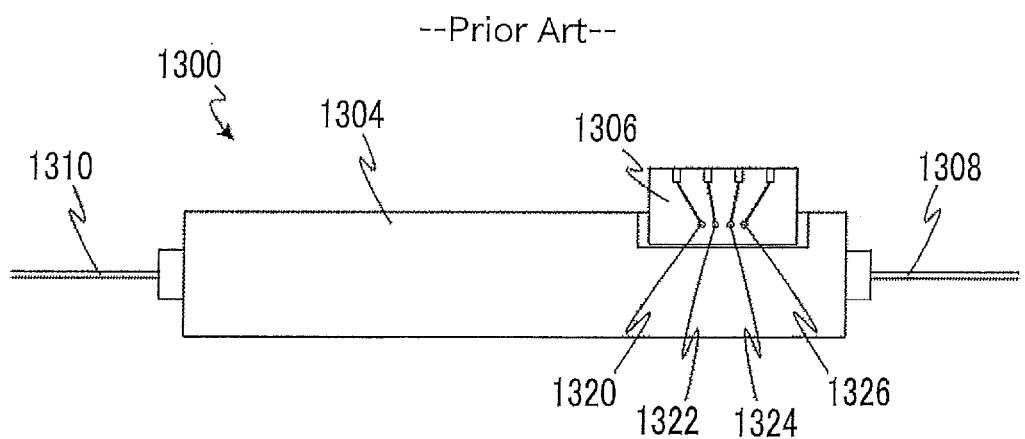
FIG. 13C is a bottom view of the optical modulator in the related art.
Figure 15A:
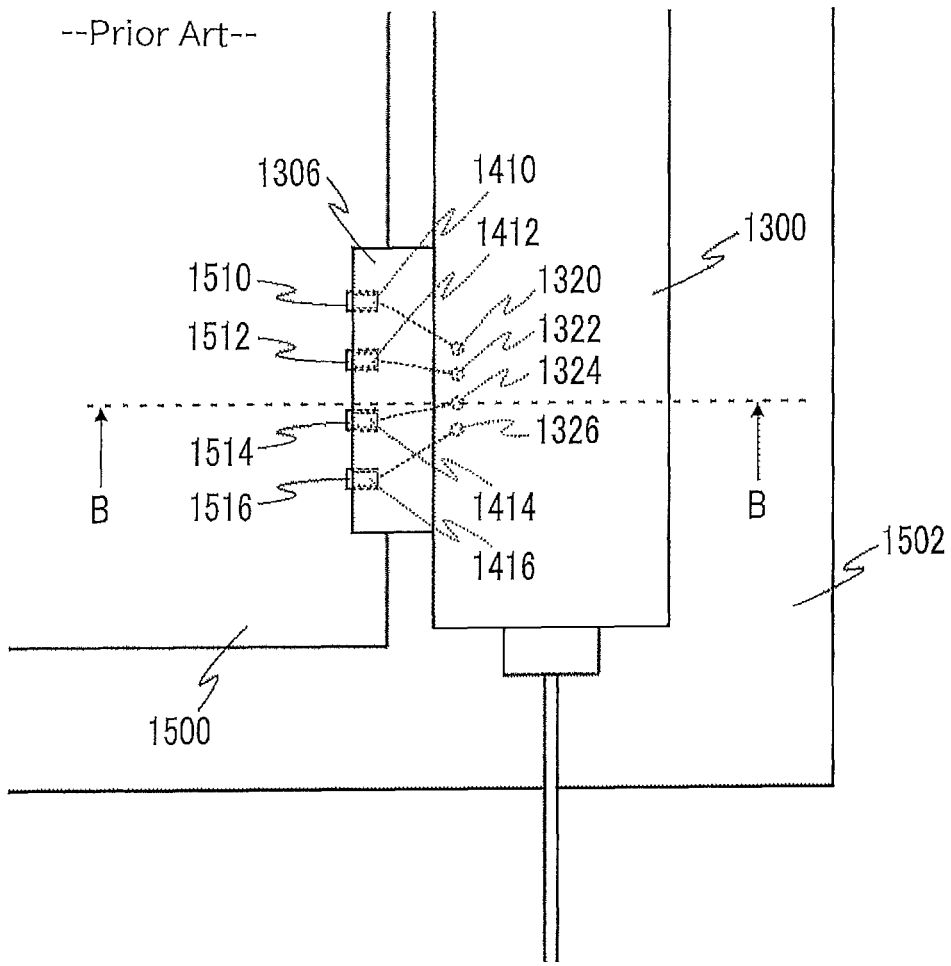
FIG. 15A is a view illustrating an example of a state in which the optical modulator illustrated in FIG. 13A is connected to a circuit substrate in which an electronic circuit is constructed.
Figure 15B:
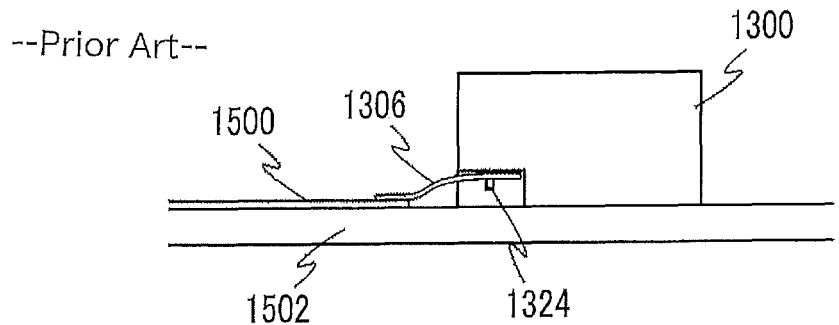
FIG. 15B is a view illustrating an example of a state in which the optical modulator illustrated in FIG. 13A is connected to a circuit substrate in which an electronic circuit is constructed.
Figure 16A:
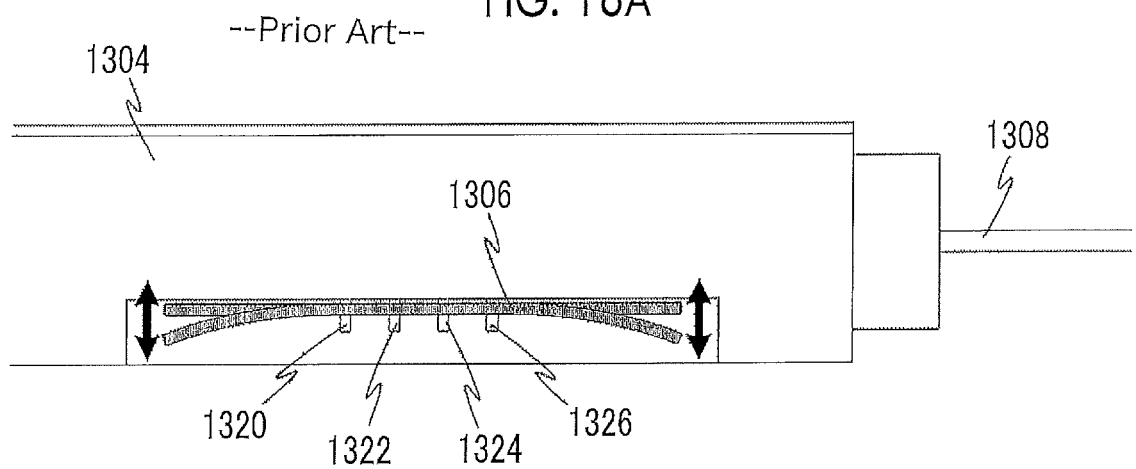
FIG. 16A is a view illustrating an example of a vibration aspect of the FPC that is used in the optical modulator illustrated in FIG. 13A.
Figure 16B:
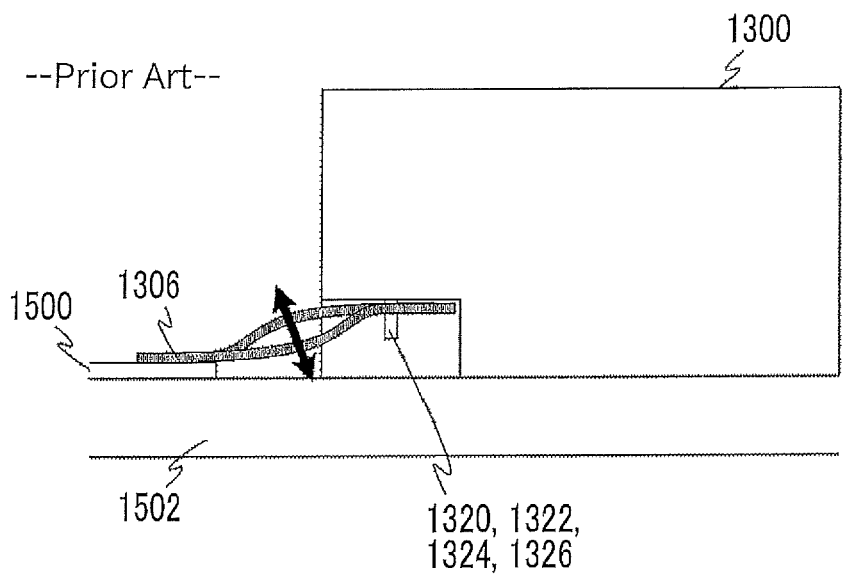
FIG. 16B is a view illustrating an example of the vibration aspect of the FPC that is used in the optical modulator illustrated in FIG. 13A.

FIG. 12 is a view illustrating a configuration of an optical transmission apparatus according to this embodiment. An optical transmission apparatus 1200 of this embodiment includes an optical modulator 1202, a light source 1204 from which a light beam is input to the optical modulator 1202, a modulation signal creating unit 1206, and a modulation data creating unit 1208.

The optical modulator 1202 is the optical modulator 100 illustrated in FIG. 1A (the optical modulator 100 may include any one of the FPCs 400, 500, 700, 900, and 1000 illustrated in FIG. 4, FIG. 5, and FIG. 7 to FIG. 10 instead of the FPC 106. In addition, the optical modulator 100 may be a modification of the optical modulator including the FPC 1100 illustrated in FIG. 11). The modulation data creating unit 1208 receives transmission data that is applied from the outside, creates modulation data (for example, data obtained by converting or processing the transmission data into a predetermined data format) for transmission of the transmission data, and outputs the modulation data that is created to the modulation signal creating unit 1206.

The modulation signal creating unit 1206 is an electronic circuit that outputs an electrical signal that allows the optical modulator 1202 to perform a modulation operation. The modulation signal creating unit 1206 creates a modulation signal that is a radio-frequency signal that allows the optical modulator 1202 to perform an optical modulation operation according to the modulation data on the basis of the modulation data that is output from the modulation data creating unit 1208, and inputs the modulation signal to the optical modulator 100. The modulation signal includes four RF signals corresponding to four RF electrodes (not illustrated) of the optical modulation element 102 that is provided in the optical modulator 100.

The four RF signals are respectively input to the pads 210, 212, 214, and 216 of the FPC 106 (may be any one of the above-described modification examples of the FPC 106) of the optical modulator 100, and are respectively applied to the RF electrodes through the wiring patterns 230, 232, 234, and 236, the signal through-holes 220, 222, 224, and 226, and the signal lead pins 120, 122, 124, and 126.

According to this, light beams, which are output from the light source 1204, are modulated into modulated light beams by the optical modulator 100, and are output from the optical transmission apparatus 1200.

Particularly, in the optical transmission apparatus 1200, the optical modulator 100 having the above-described configuration is used, and it is possible to secure satisfactory optical transmission quality by suppressing occurrence of peeling-off or cracks, which are caused by environmental vibration during transportation or operation of the optical transmission apparatus 1200, of the solder-fixing portion or the solder-connecting portion in the FPC 106.

Furthermore, in the above-described embodiments, description has been given of the optical modulator provided with the optical modulation element in which LN is used as a substrate and which includes the four RF electrodes. However, the invention is not limited thereto, and the may also be applied to an optical modulator including the RF electrode in number other than four, and an optical modulator that uses a material other than LN is used as the substrate. In addition, the configuration of the FPC 106 as illustrated in FIG. 2, and the configurations of the modification examples of the FPC 106 as illustrated in FIG. 4 to FIG. 11 can be used alone as individual FPCs, or the configurations can be used as one FPC in appropriate combination thereof.

REFERENCE SIGNS LIST 100, 1202, 1300: optical modulator
102, 1302: optical modulation element
104, 1304: housing
106, 400, 500, 700, 800, 900, 1000, 1100, 1306: FPC
108, 110, 1308, 1310: optical fiber
120, 122, 124, 126, 1320, 1322, 1324, 1326: signal lead pin
130, 132: additional lead pin
200, 202, 204, 206, 1400, 1402, 1404, 1406: side
210, 212, 214, 216, 310, 312, 314, 316, 1410, 1412, 1414, 1416, 1510, 1512, 1514, 1516: pad
220, 222, 224, 226, 1110, 1112, 1420, 1422, 1424, 1426: signal through-hole
230, 232, 234, 236, 1430, 1432, 1434, 1436: wiring pattern
240, 242, 410, 412, 510, 512, 710, 712, 714, 716, 718, 720, 722, 724, 726, 728, 910, 912, 1120, 1122, 1124, 1130,
1132, 1134: additional through-hole
1010, 1012: corner
300, 1500: circuit substrate,
302, 1502: base
810, 812, 1020, 1022: notched portion
1200: optical transmission apparatus
1204: light source
1206: modulation signal creating unit
1208: modulation data creating unit.

The invention claimed is:

1. An optical modulator comprising:
a housing, and
a flexible printed circuit that performs electrical connection with a circuit substrate,
wherein the flexible printed circuit has a substantially quadrilateral shape,
the housing has a bottom surface which faces the circuit substrate and from which signal lead pins for signal transmission protrude,
in the flexible printed circuit, a pad, which is electrically connected to the circuit substrate, is provided along one side of the substantial quadrilateral, and signal patterns, which are connected to the signal lead pins, are provided in an other side opposite to the one side, and
the flexible printed circuit includes an additional fixing portion not connected to the signal lead pins,
the additional fixing portion includes an additional lead pin that is additionally provided in the housing and protruded from the bottom surface of the housing, and an additional pattern that is provided on the flexible printed circuit and to be connected to the additional lead pin, wherein, the signal lead pins and the additional lead pin has substantially same diameter, and the distance from the other side to the additional pattern and the distance from the other side to the signal patterns are configured to be different.

2. The optical modulator according to claim 1, wherein the additional pattern is configured to electrically connect a ground pattern provided in the flexible printed circuit and the housing of the optical modulator to each other.

3. The optical modulator according to claim 1, wherein the additional fixing portions are configured with the additional patterns provided at respective sites between two sides excluding the one side and the other side of the substantial quadrilateral, and respective ends of an arrangement portion of the signal patterns, the number of the additional pattern provided at each of the sites being at least one.

4. The optical modulator according to claim 3, wherein the additional fixing portions include at least one of the additional patterns provided between the arrangement portion and the one side.

5. The optical modulator according to claim 4, wherein the additional fixing portions further include at least one of the additional pattern that is provided between the arrangement portion and the other side.

6. The optical modulator according to claim 5, wherein a distance d, which is measured in a direction perpendicular to the one side, between the additional pattern provided between the arrangement portion and the one side, and the additional pattern provided between the arrangement portion and the other side has a relationship of d≥Lp/5 with respect to a distance Lp, which is measured in a direction perpendicular to the one side, between a pad end opposite to the one side and the additional pattern provided between the arrangement portion and the one side.

7. The optical modulator according to claim 6, wherein the additional pattern provided between the arrangement portion and the one side, and the additional pattern provided between the arrangement portion and the other side are disposed to surround the signal patterns from all directions.

8. The optical modulator according to claim 7, wherein the additional fixing portions further include the additional patterns provided at respective sites between two sides excluding the one side and the other side, and respective ends of the arrangement portion, the number of the additional pattern provided at each of the sites being at least one.

9. The optical modulator according to claim 7, wherein a notched portion is provided from each of the two sides excluding the one side and the other side toward the arrangement portion.

10. The optical modulator according to claim 9, wherein the notched portion is provided at each of two corners formed by two sides excluding the one side and the other side opposite to the one side, and the other side, and the notched portion is provided so that a distance between the respective ends of the arrangement portion and an edge of the notched portion in a direction along the one side varies in accordance with a distance that is measured from the one side along a direction perpendicular to the one side.

11. The optical modulator according to claim 7, wherein the arrangement portion includes one or a plurality of arrangement portions, and distances between respective ends of two arrangement portions closest to the two sides excluding the one side and the other side, and the corresponding two sides are different from each other.

12. An optical transmission apparatus comprising:
the optical modulator according to claim 1; and
an electronic circuit that outputs an electrical signal to the optical modulator to allow the optical modulator to perform a modulation operation.

* * * * *